(12) United States Patent
Li

(10) Patent No.: US 12,635,342 B2
(45) Date of Patent: May 19, 2026

(54) DISPLAY PANEL AND FORMATION METHOD THEREOF, AND DISPLAY APPARATUS FOR IMPROVING ELECTRICAL CHARACTERISTICS OF A TRANSISTOR AND REDUCING RESISTANCE OF POWER SUPPLY VOLTAGE SIGNAL LINE

(71) Applicant: Hubei Yangtze Industrial Innovation Center of Advanced Display Co., LTD., Wuhan (CN)

(72) Inventor: Fei Li, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 388 days.

(21) Appl. No.: 18/225,006

(22) Filed: Jul. 21, 2023

(65) Prior Publication Data

US 2024/0365586 A1 Oct. 31, 2024

(30) Foreign Application Priority Data

Apr. 26, 2023 (CN) .......................... 202310462178.7

(51) Int. Cl.
*H10K 59/121* (2023.01)
*H10K 59/12* (2023.01)
*H10K 59/131* (2023.01)
*H10K 59/80* (2023.01)
(Continued)

(52) U.S. Cl.
CPC ..... *H10K 59/1213* (2023.02); *H10K 59/1201* (2023.02); *H10K 59/1216* (2023.02); *H10K 59/1315* (2023.02); *H10K 59/8792* (2023.02); *H10K 71/166* (2023.02); *H10K 71/233* (2023.02)

(58) Field of Classification Search
None
See application file for complete search history.

(56) References Cited

U.S. PATENT DOCUMENTS

| | | | | |
|---|---|---|---|---|
| 2015/0187959 A1* | 7/2015 | Yoon | .................. | H10D 30/6755 257/43 |
| 2021/0367026 A1* | 11/2021 | Xu | ........................ | H10K 59/126 |
| 2022/0208908 A1* | 6/2022 | Kim | ...................... | H10K 59/122 |

FOREIGN PATENT DOCUMENTS

| | | |
|---|---|---|
| CN | 113206038 A | 8/2021 |
| CN | 114023764 A | 2/2022 |

* cited by examiner

*Primary Examiner* — Nduka E Ojeh
(74) *Attorney, Agent, or Firm* — Anova Law Group, PLLC

(57) ABSTRACT

A display panel, a formation method of the display panel, and a display apparatus are provided in the present disclosure. The display panel includes a base substrate, an array layer on a side of the base substrate, and a light-blocking part on a side of a semiconductor adjacent to the base substrate. The array layer includes a drive circuit, where the drive circuit includes a plurality of transistors, and the transistor includes the semiconductor; and further includes a power supply voltage signal line on a side of the semiconductor away from the base substrate. The light-blocking part includes a first light-blocking part and a second light-blocking part; the first light-blocking part is electrically connected to the power supply voltage signal line; and along a direction perpendicular to a plane of the base substrate, a semiconductor of each transistor is at least partially overlapped with the second light-blocking part.

16 Claims, 23 Drawing Sheets

B–B'

(51) Int. Cl.
    *H10K 71/16*         (2023.01)
    *H10K 71/20*         (2023.01)

A–A'

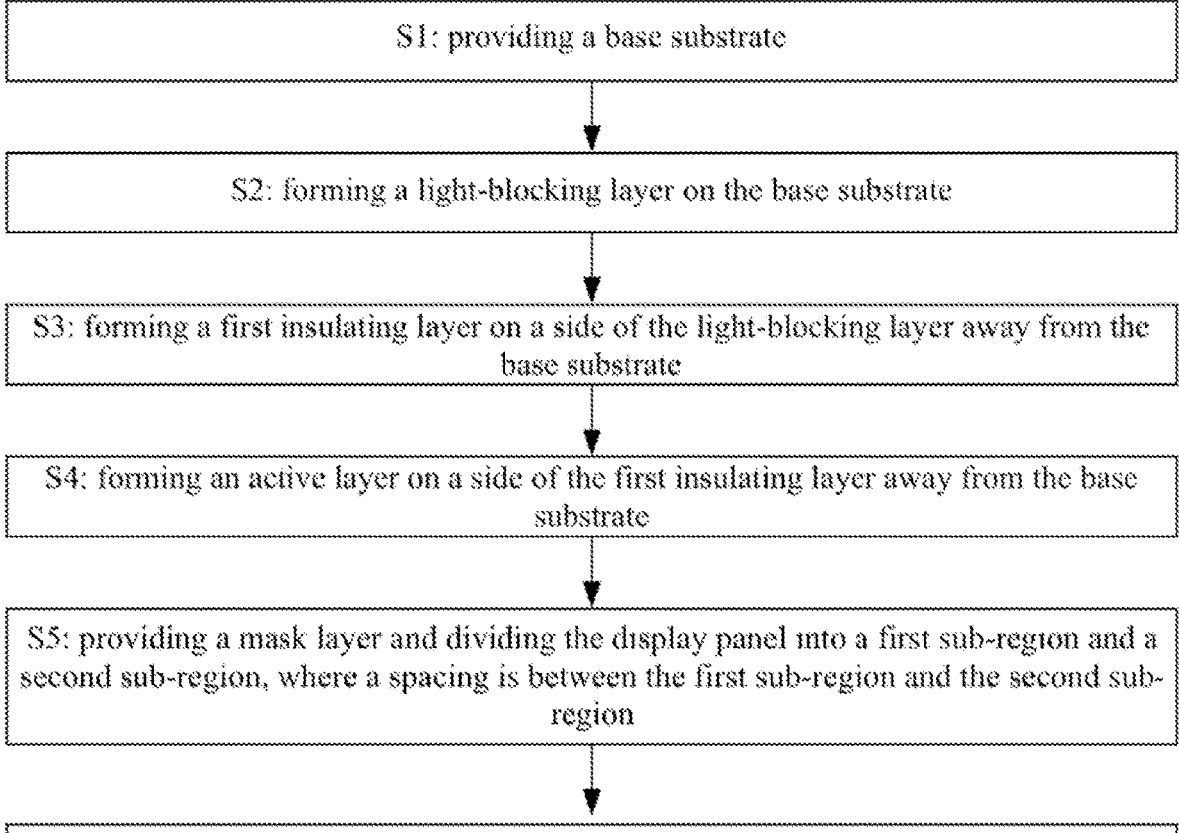

S1: providing a base substrate

S2: forming a light-blocking layer on the base substrate

S3: forming a first insulating layer on a side of the light-blocking layer away from the base substrate S4: forming an active layer on a side of the first insulating layer away from the base substrate S5: providing a mask layer and dividing the display panel into a first sub-region and a second sub-region, where a spacing is between the first sub-region and the second sub-region S6: etching the active layer, the first insulating layer and the light-blocking layer using a same mask; retaining the active layer in the first sub-region as a semiconductor of a transistor; and dividing the light-blocking layer into a first light-blocking part and a second light-blocking part, where along a direction perpendicular to a plane of the base substrate, a semiconductor of each transistor is at least partially overlapped with the second light-blocking part

FIG. 9

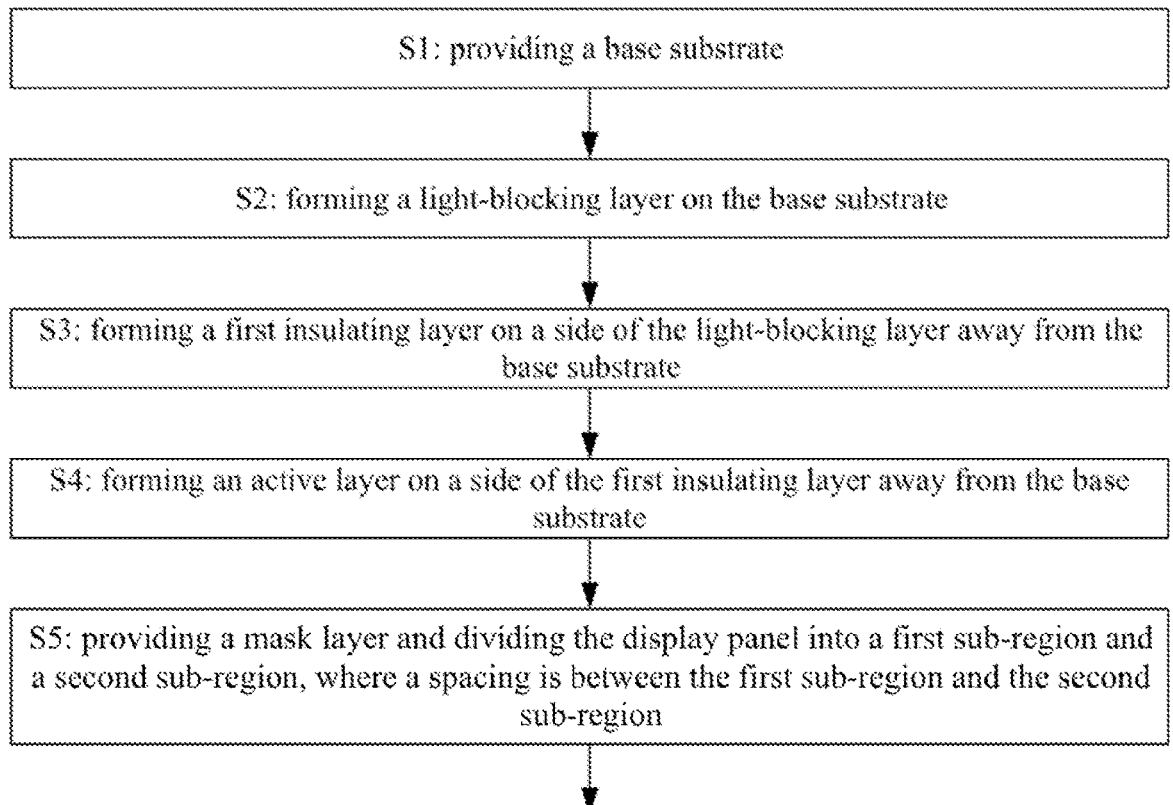

S1: providing a base substrate

S2: forming a light-blocking layer on the base substrate

S3: forming a first insulating layer on a side of the light-blocking layer away from the base substrate S4: forming an active layer on a side of the first insulating layer away from the base substrate S5: providing a mask layer and dividing the display panel into a first sub-region and a second sub-region, where a spacing is between the first sub-region and the second sub-region S6: etching the active layer, the first insulating layer and the light-blocking layer using a same mask; retaining the active layer in the first sub-region as a semiconductor of a transistor; dividing the light-blocking layer into a first light-blocking part and a second light-blocking part, where along a direction perpendicular to a plane of the base substrate, a semiconductor of each transistor is at least partially overlapped with the second light-blocking part; and removing the active layer in the second sub-region; and retaining the first insulating layer and the light-blocking layer in the second sub-region

FIG. 11

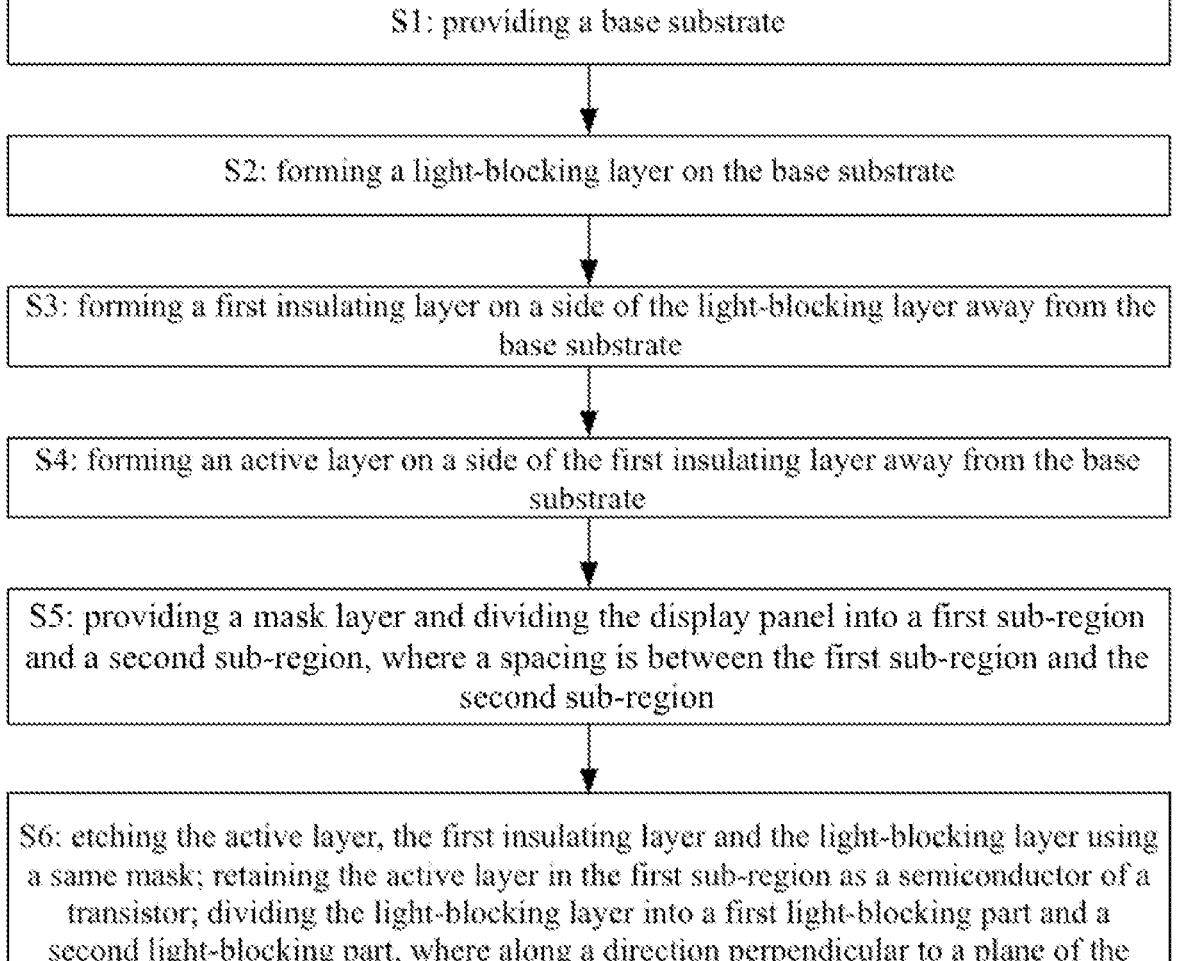

S1: providing a base substrate

S2: forming a light-blocking layer on the base substrate

S3: forming a first insulating layer on a side of the light-blocking layer away from the base substrate S4: forming an active layer on a side of the first insulating layer away from the base substrate S5: providing a mask layer and dividing the display panel into a first sub-region and a second sub-region, where a spacing is between the first sub-region and the second sub-region S6: etching the active layer, the first insulating layer and the light-blocking layer using a same mask; retaining the active layer in the first sub-region as a semiconductor of a transistor; dividing the light-blocking layer into a first light-blocking part and a second light-blocking part, where along a direction perpendicular to a plane of the base substrate, a semiconductor of each transistor is at least partially overlapped with the second light-blocking part; removing the active layer in the second sub-region; and retaining the first insulating layer and the light-blocking layer in the second sub-region S7: forming a second insulating layer, where the second insulating layer covers the first sub-region, the second sub-region and the spacing between the first sub-region and the second sub-region

FIG. 13

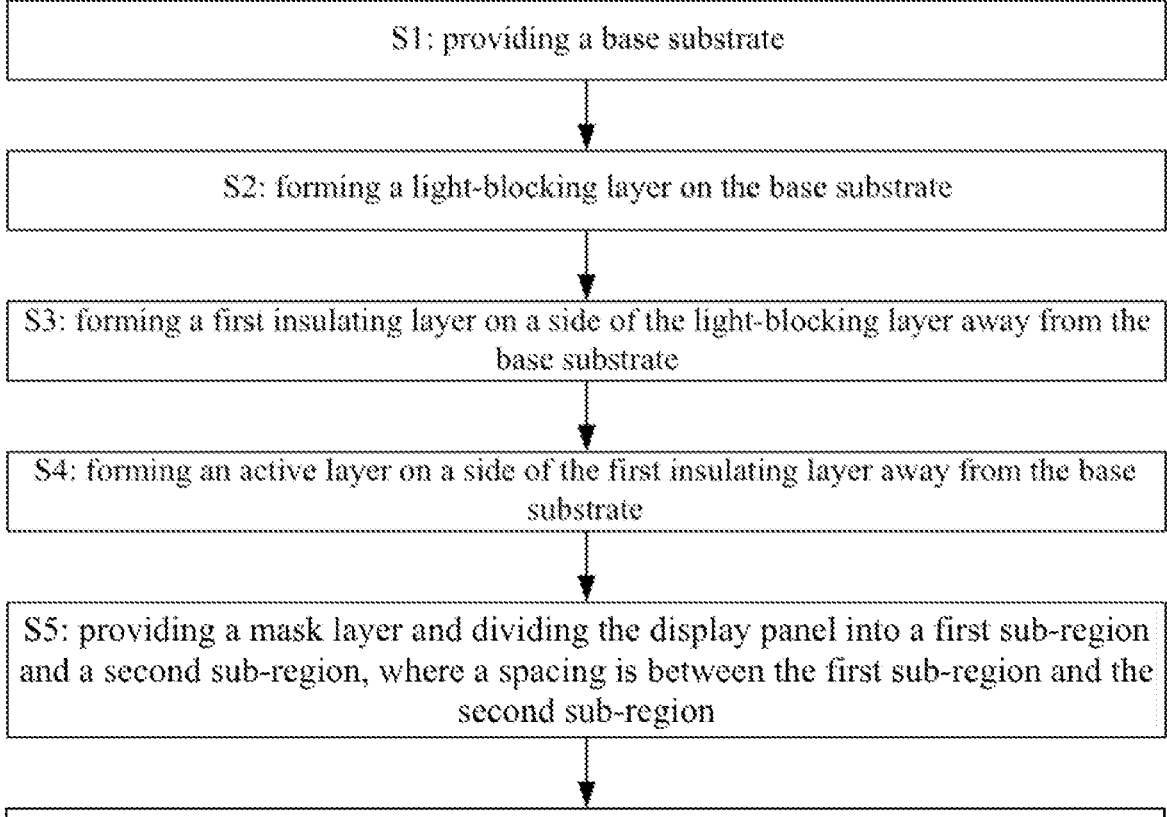

S1: providing a base substrate

S2: forming a light-blocking layer on the base substrate

S3: forming a first insulating layer on a side of the light-blocking layer away from the base substrate S4: forming an active layer on a side of the first insulating layer away from the base substrate S5: providing a mask layer and dividing the display panel into a first sub-region and a second sub-region, where a spacing is between the first sub-region and the second sub-region S6: etching the active layer, the first insulating layer and the light-blocking layer using a same mask; retaining the active layer in the first sub-region as a semiconductor of a transistor; dividing the light-blocking layer into a first light-blocking part and a second light-blocking part, where along a direction perpendicular to a plane of the base substrate, a semiconductor of each transistor is at least partially overlapped with the second light-blocking part; simultaneously removing the active layer and the first insulating layer in the second sub-region; and retaining the light-blocking layer in the second sub-region as the first light-blocking part

FIG. 15

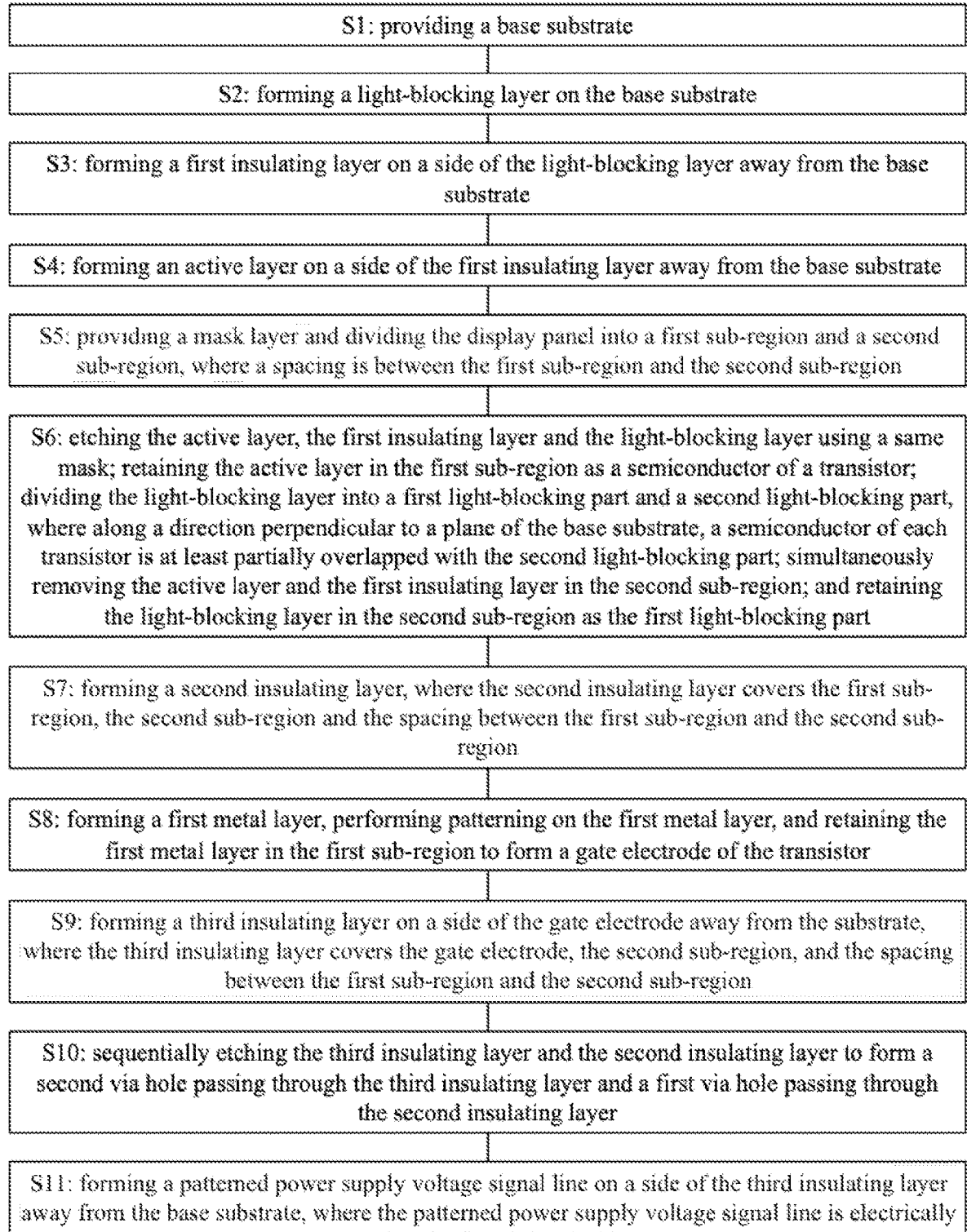

S1: providing a base substrate

S2: forming a light-blocking layer on the base substrate

S3: forming a first insulating layer on a side of the light-blocking layer away from the base substrate S4: forming an active layer on a side of the first insulating layer away from the base substrate S5: providing a mask layer and dividing the display panel into a first sub-region and a second sub-region, where a spacing is between the first sub-region and the second sub-region S6: etching the active layer, the first insulating layer and the light-blocking layer using a same mask; retaining the active layer in the first sub-region as a semiconductor of a transistor; dividing the light-blocking layer into a first light-blocking part and a second light-blocking part, where along a direction perpendicular to a plane of the base substrate, a semiconductor of each transistor is at least partially overlapped with the second light-blocking part; simultaneously removing the active layer and the first insulating layer in the second sub-region; and retaining the light-blocking layer in the second sub-region as the first light-blocking part S7: forming a second insulating layer, where the second insulating layer covers the first sub-region, the second sub-region and the spacing between the first sub-region and the second sub-region S8: forming a first metal layer, performing patterning on the first metal layer, and retaining the first metal layer in the first sub-region to form a gate electrode of the transistor S9: forming a third insulating layer on a side of the gate electrode away from the substrate, where the third insulating layer covers the gate electrode, the second sub-region, and the spacing between the first sub-region and the second sub-region S10: sequentially etching the third insulating layer and the second insulating layer to form a second via hole passing through the third insulating layer and a first via hole passing through the second insulating layer S11: forming a patterned power supply voltage signal line on a side of the third insulating layer away from the base substrate, where the patterned power supply voltage signal line is electrically connected to the first light-blocking part

FIG. 17

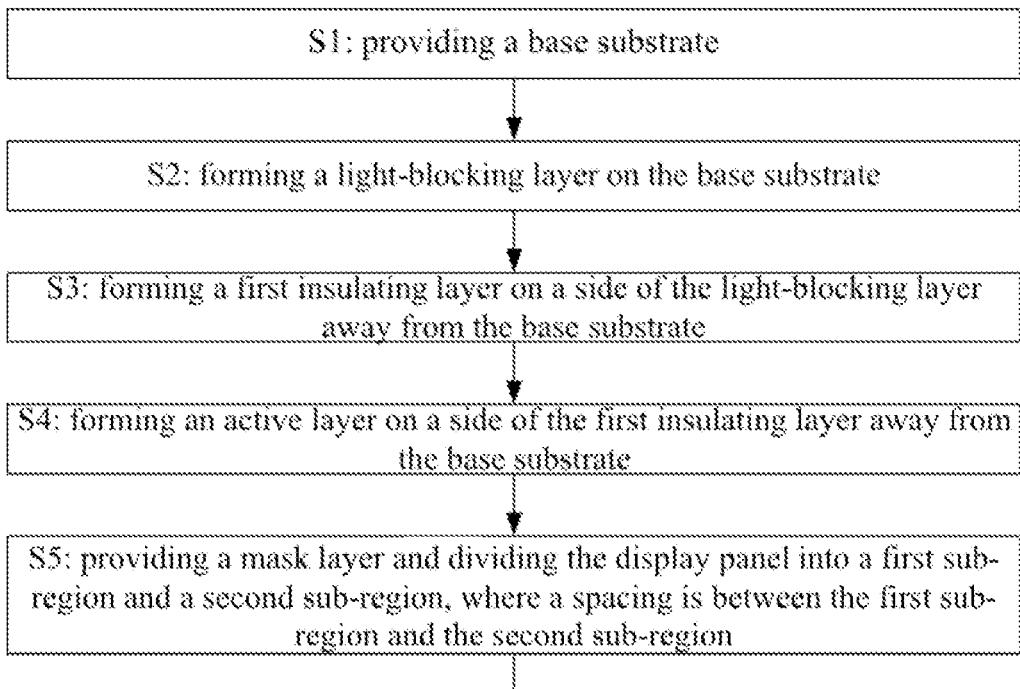

S1: providing a base substrate

S2: forming a light-blocking layer on the base substrate

S3: forming a first insulating layer on a side of the light-blocking layer away from the base substrate S4: forming an active layer on a side of the first insulating layer away from the base substrate S5: providing a mask layer and dividing the display panel into a first sub-region and a second sub-region, where a spacing is between the first sub-region and the second sub-region S6: forming an entire-surface photoresist on a side of the active layer away from the base substrate; using the same mask layer to expose and develop the photoresist, where the mask layer includes a non-light-transmitting region, a partially light-transmitting region and a fully light-transmitting region; after a developing process, removing the photoresist at a position of the fully light-transmitting region, and thinning the photoresist at a position of the partially light-transmitting region, where the non-light-transmitting region corresponds to the first sub-region, and the partially light-transmitting region corresponds to the second sub-region; corresponding to the spacing between the first sub-region and the second sub-region, etching the active layer, the first insulating layer and the light-blocking layer sequentially; retaining the active layer in the first sub-region as a semiconductor of a transistor; and dividing the light-blocking layer into a first light-blocking part and a second light-blocking part, where along a direction perpendicular to a plane of the base substrate, a semiconductor of each transistor is at least partially overlapped with the second light-blocking part

DISPLAY PANEL AND FORMATION METHOD THEREOF, AND DISPLAY APPARATUS FOR IMPROVING ELECTRICAL CHARACTERISTICS OF A TRANSISTOR AND REDUCING RESISTANCE OF POWER SUPPLY VOLTAGE SIGNAL LINE

CROSS-REFERENCE TO RELATED APPLICATION

The present disclosure claims the priority of Chinese Patent Application No. 202310462178.7, filed on Apr. 26, 2023, the content of which is incorporated herein by reference in its entirety.

TECHNICAL FIELD

The present disclosure generally relates to the field of display technology and, more particularly, relates to a display panel and a formation method thereof, and a display apparatus.

BACKGROUND

At present, display technology has influenced every aspect of people's daily life; and correspondingly, more materials and technologies are used in display panels. Mainstream display panels mainly include liquid crystal display panels and organic light-emitting diode (OLED) display panels.

Organic light-emitting diodes, as current-mode light-emitting devices, have been increasingly used in high-performance displays. OLED display panels have various desirable characteristics such as self-illumination, wide viewing angle, fast response speed, high contrast, wide color gamut, low energy consumption, thin panel, rich colors, flexible display, wide operating temperature range and the like, such that OLED display panels are desired flat display panels of next generation.

Thin film transistors (TFT) are the main drive elements of OLED display panels. As pixel drive circuits become more complex, the pixel drive circuits with multiple thin film transistors such as 7T1C, 16T1C and the like (T refers to thin film transistor, and C refers to storage capacitor) have been developed. A source electrode and a drain electrode of the thin film transistor transmit electrical signals through the channel part of an active layer. However, the channel part of the active layer may generate leakage current after being illuminated, and its electrical characteristics may change, thereby affecting the electrical signal transmission between the source electrode and the drain electrode and affecting the display effect of the OLED display panel. On the other hand, the OLED display panel is provided with a power supply voltage signal line to transmit a power supply voltage for the pixel drive circuit. The resistance of the power supply voltage signal line is relatively large which may cause a voltage drop; and the power supply voltage of a sub-pixel transmitted to the end of the power supply signal line may be lower than the power supply voltage of the sub-pixel at the beginning of the power supply signal line, so that the resistance of the power supply voltage signal line needs to be reduced.

Therefore, there is a need to provide a display panel and its formation method, and a display apparatus which are capable of improving electrical characteristics of the transistor and reducing the resistance of the power supply voltage signal line.

SUMMARY

One aspect of the present disclosure provides a display panel. The display panel includes a base substrate; an array layer on a side of the base substrate, where the array layer includes a drive circuit, where the drive circuit includes a plurality of transistors, and a transistor of the plurality of transistors includes a semiconductor; and the array layer further includes a power supply voltage signal line on a side of the semiconductor away from the base substrate, where the power supply voltage signal line transmits a power supply voltage for the drive circuit; and further includes a light-blocking part on a side of the semiconductor adjacent to the base substrate. The light-blocking part includes a first light-blocking part and a second light-blocking part; the first light-blocking part is electrically connected to the power supply voltage signal line; and along a direction perpendicular to a plane of the base substrate, a semiconductor of each transistor is at least partially overlapped with the second light-blocking part.

Another aspect of the present disclosure provides a formation method of a display panel. The method includes providing a base substrate; forming a light-blocking layer on the base substrate; forming a first insulating layer on a side of the light-blocking layer away from the base substrate; forming an active layer on a side of the first insulating layer away from the base substrate; providing a mask layer and dividing the display panel into a first sub-region and a second sub-region, where a spacing is between the first sub-region and the second sub-region; and etching the active layer, the first insulating layer and the light-blocking layer using a same mask layer; retaining the active layer in the first sub-region as a semiconductor of a transistor; and dividing the light-blocking layer into a first light-blocking part and a second light-blocking part, where along a direction perpendicular to a plane of the base substrate, a semiconductor of each transistor is at least partially overlapped with the second light-blocking part.

Another aspect of the present disclosure provides a display apparatus including a display panel. The display panel includes a base substrate; an array layer on a side of the base substrate, where the array layer includes a drive circuit, where the drive circuit includes a plurality of transistors, and a transistor of the plurality of transistors includes a semiconductor; and the array layer further includes a power supply voltage signal line on a side of the semiconductor away from the base substrate, where the power supply voltage signal line transmits a power supply voltage for the drive circuit; and further includes a light-blocking part on a side of the semiconductor adjacent to the base substrate. The light-blocking part includes a first light-blocking part and a second light-blocking part; the first light-blocking part is electrically connected to the power supply voltage signal line; and along a direction perpendicular to a plane of the base substrate, a semiconductor of each transistor is at least partially overlapped with the second light-blocking part.

Other aspects of the present disclosure may be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

FIG. 9 illustrates a flowchart of a formation method of a display panel according to various embodiments of the present disclosure.

FIG. 11 illustrates another flowchart of a formation method of a display panel according to various embodiments of the present disclosure.

FIG. 13 illustrates another flowchart of a formation method of a display panel according to various embodiments of the present disclosure.

FIG. 15 illustrates another flowchart of a formation method of a display panel according to various embodiments of the present disclosure.

FIG. 17 illustrates another flowchart of a formation method of a display panel according to various embodiments of the present disclosure.

FIG. 19 illustrates another flowchart of a formation method of a display panel according to various embodiments of the present disclosure.

DETAILED DESCRIPTION

Figure 1:
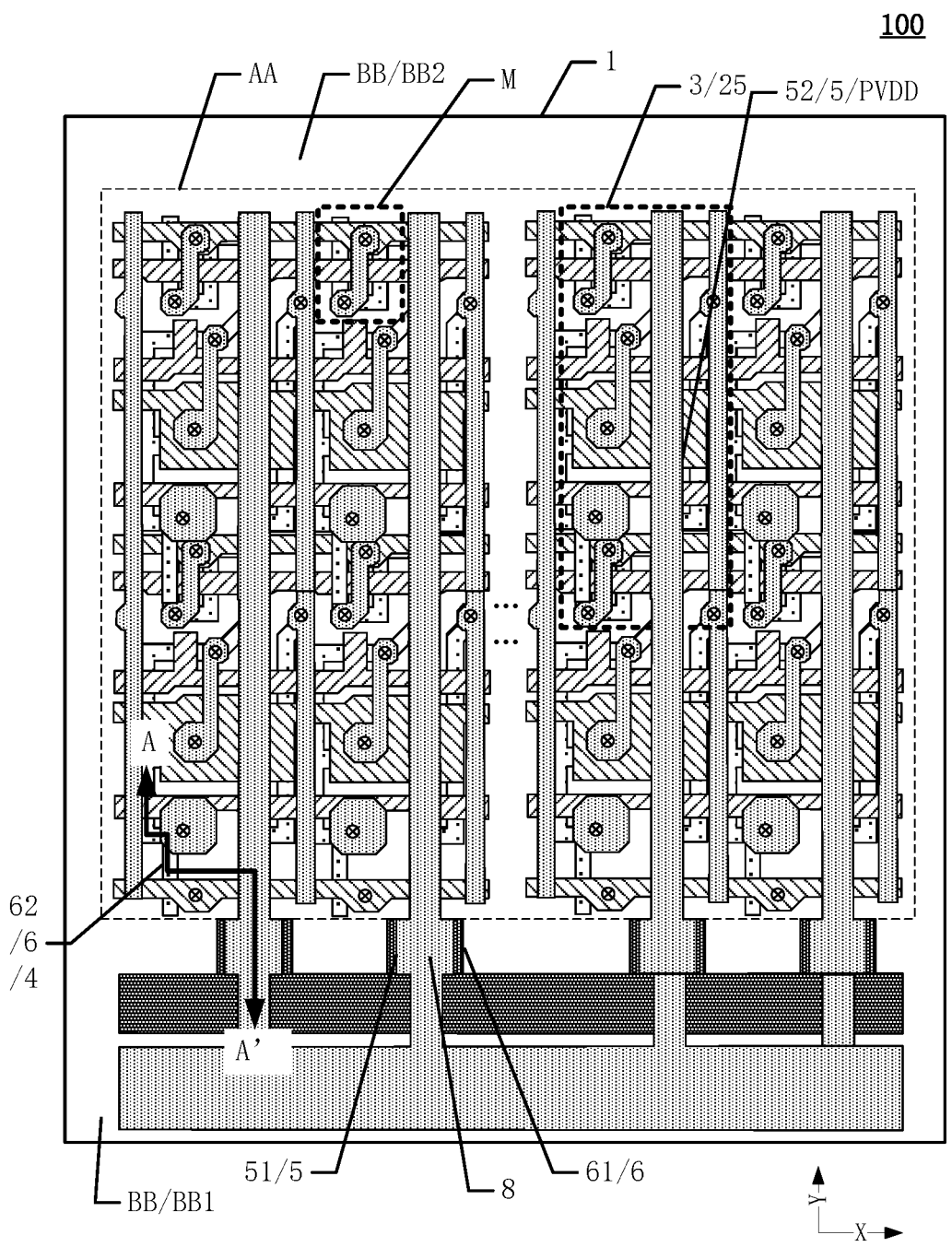
FIG. 1 illustrates a planar structural schematic of a display panel according to various embodiments of the present disclosure.

Various exemplary embodiments of the present disclosure are described in detail with reference to accompanying drawings. It should be noted that unless specifically stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary, rather than as a limitation. Therefore, other examples in exemplary embodiment may have different values.

It should be noted that similar reference numerals and letters are configured to indicate similar items in following drawings. Therefore, once an item is defined in one drawing, it does not need to be further discussed in subsequent drawings.

Figure 2:
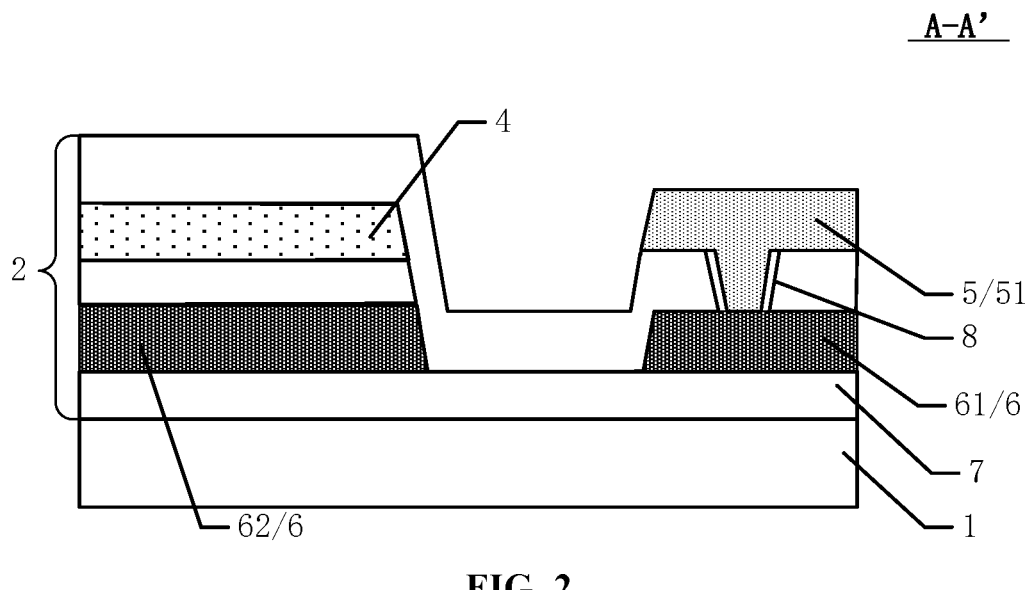
FIG. 2 illustrates a cross-sectional view along an A-A' direction in FIG. 1.

Referring to FIGS. 1-2, FIG. 1 illustrates a planar structural schematic of a display panel according to various embodiments of the present disclosure; and FIG. 2 illustrates a cross-sectional view along an A-A' direction in FIG. 1. A display panel 100 provided in one embodiment may include a base substrate 1, and an array layer 2 on the side of the base substrate 1. The array layer 2 may include a drive circuit 3 including a plurality of transistors M; and the transistors M may include a semiconductor 4. The array layer 2 may further include a power supply voltage signal line 5 on the side of the semiconductor 4 away from the base substrate 1; and the power supply voltage signal line 5 may transmit a power supply voltage for the drive circuit 3. The display panel 100 may further include a light-blocking part 6 on the side of the semiconductor 4 adjacent to the base substrate 1. The light-blocking part 6 may include a first light-blocking part 61 and a second light-blocking part 62; and the first light-blocking part 61 may be electrically connected to the power supply voltage signal line 5. Along the direction perpendicular to the plane of the base substrate 1, the semiconductor 4 of each transistor M may be at least partially overlapped with the second light-blocking part 62.

Optionally, the base substrate 1 may be a rigid substrate. Optionally, the material of the base substrate 1 may be glass. The base substrate 1 may also be a flexible substrate. Optionally, the material of the base substrate 1 may be polyimide (PI), polycarbonate (PC) or polyethylene terephthalate (PET) or the like. In FIGS. 1 and 2, pattern filling may not be performed on the base substrate 1.

The display panel 100 may include a plurality of sub-pixels 25 arranged in an array along the first direction X and the second direction Y; each sub-pixel 25 may include a light-emitting element inside; and the light-emitting element is not shown in FIG. 1, where the first direction X may intersect the second direction Y. Optionally, the first direction X and the second direction Y may be perpendicular to each other. The display panel 100 may include the array layer 2 on the side of the base substrate; and the array layer 2 may include the drive circuit 3. A display function layer may be on the side of the array layer 2 away from the base substrate 1 and include light-emitting elements. Optionally, an encapsulation layer may be further included on the side of the light-emitting element away from the base substrate 1. The display function layer and the encapsulation layer are not shown in FIGS. 1-2. In actual use, the display function layer may include an anode, a cathode, and a light-emitting material layer between the anode and the cathode. When displaying pictures, a bias voltage may be applied between the anode and the cathode; and holes and electrons may break through the interface energy barrier and migrate to the light-emitting material layer. On the light-emitting material layer, the electrons and holes may recombine to generate excitons. The excitons may be unstable to release energy, and the energy may be transferred to the molecules of the organic light-emitting substance in the light-emitting material layer, which may make the molecules transition from the ground state to the excited state. The excited state may be significantly unstable, the excited molecules may return to the ground state from the excited state, and the radiative transition may generate luminescence. It should be noted that the number of the drive circuits 3 in FIG. 1 may be only exemplary. Obviously, the number and connection relationship of the transistors M in the drive circuit 3 in FIG. 1 may also be only exemplary, which may not be intended to limit actual products. The drive circuits 3 and the light-emitting elements may be electrically connected in one-to-one correspondence, and the drive circuits 3 may drive the light-emitting elements to emit light. Optionally, the encapsulation layer may include an inorganic encapsulation layer, an organic encapsulation layer and an inorganic encapsulation layer which are sequentially stacked with each other. Obviously, the encapsulation layer may include any number of stacked organic materials and inorganic materials according to actual production requirements. However, the encapsulation layer may at least include one layer of organic material and one layer of inorganic material which are alternately deposited; and the lowermost layer (the layer closest to the base substrate 1) and the uppermost layer (the layer farthest from the base substrate 1) may be made of inorganic materials.

As shown in FIG. 2, along the direction perpendicular to the plane of the base substrate 1, the light-blocking part 6 may be disposed between the base substrate 1 and the semiconductor 4. Optionally, the material of the light-blocking part 6 may include molybdenum and may also include metals such as aluminum, chromium, and titanium or alloy thereof. The light-blocking part 6 may include the first light-blocking part 61 and the second light-blocking part 62; and the first light-blocking part 61 may be electrically connected to the power supply voltage signal line 5. Along the direction perpendicular to the plane of the base substrate 1, the semiconductor 4 of each transistor M may be at least partially overlapped with the second light-blocking part 62. In FIGS. 1 and 2, the semiconductor 4 of each transistor M may be overlapped with the second light-blocking part 62 along the direction perpendicular to the plane of the base substrate 1, which may be merely taken as an example for illustration. Obviously, the semiconductor 4 of each transistor M may be partially overlapped with the second light-blocking part 62 along the direction perpendicular to the plane of the base substrate 1; and the semiconductor 4 of each transistor M may also be located in the second light-blocking part 62 along the direction perpendicular to the plane of the base substrate 1. The leakage current may be improved to certain extent in above-mentioned scenarios.

Optionally, a buffer layer 7 may also be disposed between the base substrate 1 and the light-blocking part 6. In FIG. 2, pattern filling may not be performed on the buffer layer 7. The buffer layer 7 may be made of light-transmitting silicon oxide ($SiO_x$), silicon nitride ($SiN_x$) or a combination thereof. The buffer layer 7 may be formed on the base substrate 1. Since the base substrate 1 has a small amount of alkali metals, and silicon nitride ($SiN_x$) can block alkali metals such as sodium and potassium, the effect of blocking impurities may be desirable, which may effectively prevent the impurities contained in the base substrate 1 from diffusing into other film layers. It can be understood that the buffer layer 7 may not be needed. In one embodiment, the buffer layer 7 may be taken as an example for illustration.

Optionally, the semiconductor 4 may be made of a poly-silicon material. The semiconductor 4 made of the polysilicon material may have a significantly sensitive response speed. An amorphous silicon thin film can be transformed into a polycrystalline silicon thin film by processes of excimer laser annealing, metal optimized crystallization or solid phase crystallization. Obviously, the semiconductor 4 may also be an oxide semiconductor material or an amorphous silicon material, which may not be limited herein.

The power supply voltage signal line 5 may be on the side of the semiconductor 4 away from the base substrate 1. The power supply voltage signal line 5 may transmit the power supply voltage for the drive circuit 3. The power supply voltage herein may be a high potential or a low potential, which may not be limited herein. The material of the power supply voltage signal line 5 may include molybdenum and also include metals such as aluminum, chromium, and titanium or alloys thereof. Optionally, the material of the power supply voltage signal line 5 may be same as the material of the light-blocking part 6, so that there is no need to additionally select the material of the light-blocking part 6.

Compared with the existing technology, the display panel 100 of the present disclosure may at least have the following beneficial effects.

Along the direction perpendicular to the plane of the base substrate 1, the semiconductor 4 of each transistor M may be at least partially overlapped with the second light-blocking part 62. When ambient light irradiates the transistor M from the side of the base substrate 1 away from the light-emitting surface of the display panel 100 (i.e., the back side), the second light-blocking part 62 may prevent the light from irradiating each semiconductor 4, which may prevent each transistor M from leakage current, improve electrical characteristics of each transistor M, and improve the display performance of the display panel 100. Compared with only providing the light-blocking layer 60 on the backside of the semiconductors 4 of some transistors M, the present disclosure may have a desirable effect of preventing leakage current.

In the existing technology, the resistance of the power supply signal line may be relatively large to cause a voltage drop, and the power supply voltage of the sub-pixel transmitted at the end of the power supply signal line may be lower than the power supply voltage of the sub-pixel at the beginning of the power supply signal line. Therefore, the light-emitting brightness of the sub-pixel at the beginning of the power supply signal line may be greater than the brightness of the sub-pixel at the end of the power supply voltage signal line, which may result in uneven brightness in the display panel. In the present disclosure, the first light-blocking part 61 may be electrically connected to the power supply voltage signal line 5. The first light-blocking part 61 may be connected in parallel with the power supply voltage signal line 5; and the total resistance after the parallel connection may be less than the resistance before the power supply voltage signal line 5 is not connected in parallel with the first light-blocking part 61, which may reduce the resistance of the power supply voltage signal line 5. When the power supply voltage signal is transmitted in the power supply voltage signal line 5, the resistance of the power supply voltage signal line 5 itself may decrease, such that the voltage drop may be also reduced, and the voltage difference between the power supply voltage transmitted to the end of the power supply voltage signal line 5 and the power supply voltage transmitted to the beginning of the power supply voltage signal line 5 may decrease. According to the light-emitting current formula $Id=k(Vsg-|Vth|)^2=k$ $(PVDD-Vdata-|Vth|)^2$ of the light-emitting element, the light-emitting current of each light-emitting element may be positively correlated with the power supply voltage. If the voltage difference between the power supply voltage transmitted to the end of the power supply voltage signal line 5 and the power supply voltage transmitted to the beginning of the power supply voltage signal line 5 decreases, the difference between the light-emitting current of the light-emitting element at the end of the power supply voltage signal line 5 and the light-emitting current of the light-emitting element at the beginning of the power supply voltage signal line 5 may also decrease, and the light-emitting brightness difference of the light-emitting elements may be reduced, thereby being beneficial for improving display uniformity. In addition, reducing the resistance of the power supply voltage signal line 5 may also reduce the power consumption of the display panel 100.

In some optional embodiments, referring to FIGS. 1-2, the display panel 100 may include a display region AA and a non-display region BB at least partially surrounding the display region AA; the power supply voltage signal line 5 may include a first part 51 and a second part 52 which are connected to each other; the first part 51 may be in the non-display region BB, and the second part 52 may be in the display region AA; and the first light-blocking part 61 may be electrically connected to the first part 51.

For example, the display panel 100 in FIG. 1 may include the display region AA and the non-display region BB surrounding the display region AA. FIG. 1 only shows the case where the non-display region BB completely surrounds the display region AA. Obviously, the non-display region BB may also partially surround the display region AA, such as a water drop screen, which may not be limited herein. The non-display region BB may include an upper frame BB2 and a lower frame BB1 which are oppositely arranged along the second direction Y; and a drive chip (not shown in drawings) may be bound in the lower frame BB1.

The power supply voltage signal line 5 in FIG. 1 may include the first part 51 in the non-display region BB and the second part 52 in the display region. The first part 51 and the second part 52 may be a single structure, that is, the first part 51 and the second part 52 may be connected to each other. The first part 51 may extend along the first direction X, and the second parts 52 may be arranged along the second direction Y. It can be understood that a plurality of second parts 52 may be included, and each second part 52 may transmit a power supply voltage for the light-emitting element in the sub-pixel column. In FIG. 1, only the first part 51 in the lower frame BB1 may be taken as an example for illustration.

In one embodiment, the first light-blocking part 61, which may be also in the non-display region, may be electrically connected to the first part 51, which may reduce the resistance of the power supply voltage signal line 5. Obviously, the position where the first light-blocking part 61 is connected to the power supply voltage signal line 5 may be in the non-display region, so that the opening area of the sub-pixel 25 in the display region AA may not be occupied, which may increase the opening area of the display panel 100.

In some optional embodiments, referring to FIGS. 1-2, the first light-blocking part 61 may be electrically connected to the first part 51 through a via hole 8.

It can be understood that, for the case that an insulating layer is on the side of the first light-blocking part 61 away from the base substrate 1, a via hole may be punched in the insulating layer, thereby realizing the electrical connection between the first light-blocking part 61 and the first part 51.

Optionally, there may be a plurality of via holes 8; and the number of via holes 8 may correspond to the number of the second parts 52. The more the number of via holes 8 is, the larger the contact area between the first light-blocking part 61 and the first parts 51 is, and the more stable the electrical connection between the first light-blocking part 61 and the first parts 51 is.

Figure 3:
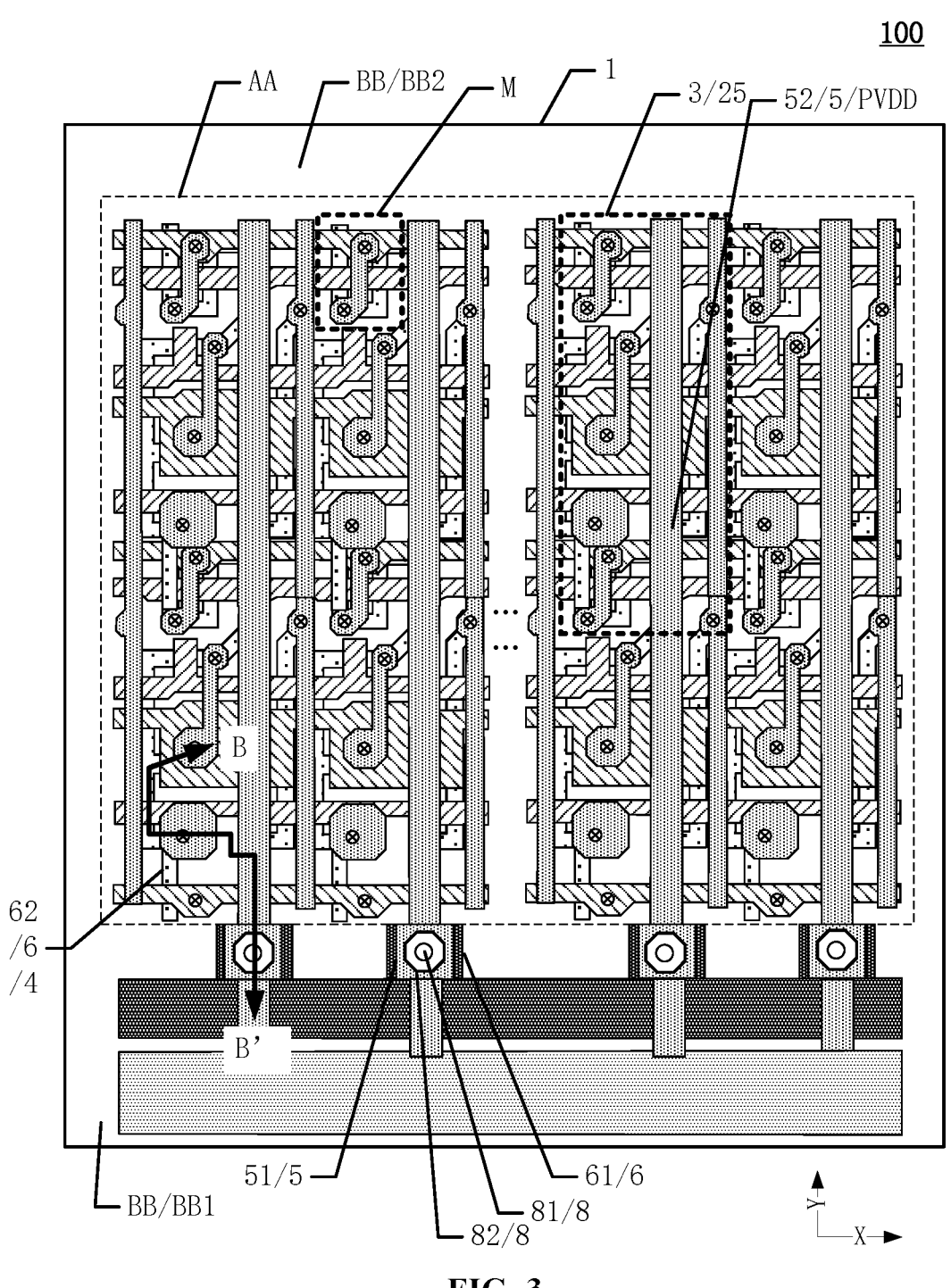
FIG. 3 illustrates another planar structural schematic of a display panel according to various embodiments of the present disclosure.
Figure 4:
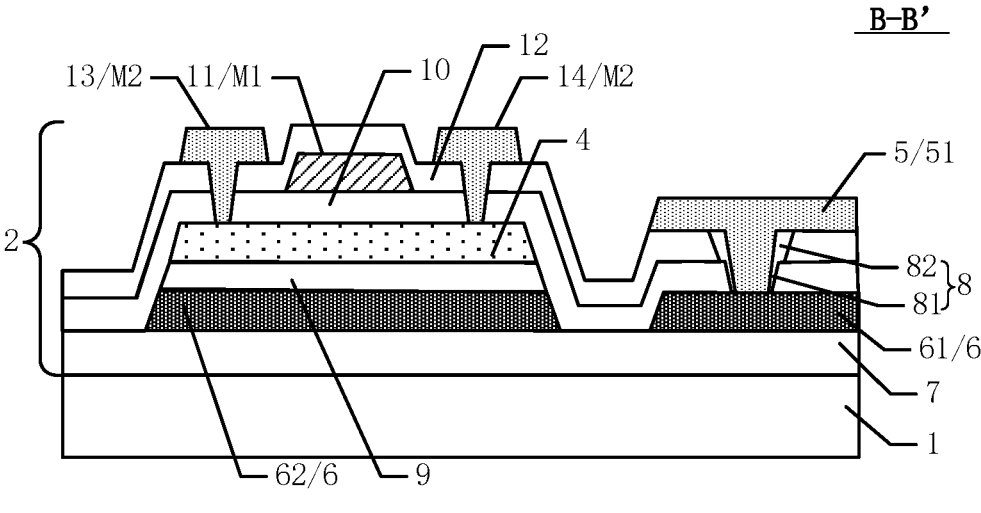
FIG. 4 illustrates a cross-sectional view along a B-B' direction in FIG. 3.

In some optional embodiments, referring to FIGS. 3-4, FIG. 3 illustrates another planar structural schematic of a display panel according to various embodiments of the present disclosure; and FIG. 4 illustrates a cross-sectional view along a B-B' direction in FIG. 3. Along the direction perpendicular to the plane of the base substrate 1, a first insulating layer 9 may be also on the side of the second light-blocking part 62 adjacent to the semiconductor 4.

A second insulating layer 10 may be on the side of the semiconductor 4 away from the base substrate 1; and the second insulating layer 10 may cover both the semiconductor 4 and the first light-blocking part 61.

A gate electrode 11 may be on the side of the second insulating layer 10 away from the substrate 1.

A third insulating layer 12 may be on the side of the gate electrode 11 away from the substrate 1; and the third insulating layer 12 may cover both the gate electrode 11 and the second insulating layer 10.

A second metal layer M2 may be on the side of the third insulating layer 12 away from the base substrate 1; and the power supply voltage signal line 5 may be at the second metal layer M2.

The via hole 8 may include a first via hole 81 passing through the second insulating layer 10 and a second via hole 82 passing through the third insulating layer 12; and the first via hole 81 may be connected to the second via hole 82.

For example, the first insulating layer 9 may be between the second light-blocking part 62 and the semiconductor 4 for insulation. The first insulating layer 9 may be made of silicon oxide ($SiO_x$) or silicon nitride ($SiN_x$), or a stacked structure of silicon oxide ($SiO_x$) and silicon nitride ($SiN_x$).

The second insulating layer 10 may be on the side of the semiconductor 4 away from the base substrate 1. The second insulating layer 10 may be made of silicon oxide ($SiO_x$) or silicon nitride ($SiN_x$), or a stacked structure of silicon oxide ($SiO_x$) and silicon nitride ($SiN_x$). The second insulating layer 10 may cover both the semiconductor 4 and the first light-blocking part 61. That is, the second insulating layer 10 may be on both the side of the first light-blocking part 61 away from the base substrate 1 and the side of the semiconductor 4 away from the base substrate 1. A same film layer may be on the side of the first light-blocking part 61 away from the base substrate 1 and the side of the semiconductor 4 away from the base substrate 1.

The gate electrode 11 may be on the side of the second insulating layer 10 away from the substrate 1. The gate electrode 11 may be at the first metal layer M1. Optionally, the gate electrode may be made of a single layer or multi-layer of gold (Au), silver (Ag), copper (Cu), nickel (Ni), platinum (Pt), palladium (Pd), aluminum (Al), molybdenum (Mo), or chromium (Cr); or may be made of an alloy such as aluminum (Al)/neodymium (Nd) alloy or molybdenum (Mo)/tungsten (W) alloy.

The third insulating layer 12 may be on the side of the gate electrode 11 away from the substrate 1. The third insulating layer 12 may be made of silicon oxide ($SiO_x$) or silicon nitride ($SiN_x$), or a stacked structure of silicon oxide ($SiO_x$) and silicon nitride ($SiN_x$). The third insulating layer 12 may cover both the gate electrode 11 and the second insulating layer 10. The second insulating layer 10 and the third insulating layer 12 may be on both the side of the first light-blocking part 61 away from the base substrate 1 and the side of the semiconductor 4 away from the base substrate 1. A same film layer may be on the side of the first light-blocking part 61 away from the base substrate 1 and the side of the semiconductor 4 away from the base substrate 1.

The second metal layer M2 may be on the side of the third insulating layer 12 away from the base substrate 1. The power supply voltage signal line 5 may be at the second metal layer M2. Optionally, the second metal layer M2 may further include a source electrode 13 and a drain electrode 14 of the transistor M. The power supply voltage signal line 5 may be at a same layer as the source electrode 13 and the drain electrode 14 of the transistor M. In such way, the power supply voltage signal line 5, the source electrode 13 and the drain electrode 14 of the transistor M may be formed in a same formation process.

The via hole 8 may include the first via hole 81 passing the second insulating layer 10 and the second via hole 82 passing the third insulating layer 12. The first via hole 81 may be connected to the second via hole 82. During the formation process, the third insulating layer 12 may be etched first to form the second via hole 82, and the second insulating layer 10 may be etched to form the first via hole 81. There is no need to use a new mask layer 20 to form the first via hole 81. That is, the second via hole 82 and the first via hole 81 may be formed by using one mask layer 20, which can save production cost.

In some optional embodiments, referring to FIG. 4, along the direction perpendicular to the plane of the base substrate 1, the area of the orthographic projection of the second via hole 82 may be greater than the area of the orthographic projection of the first via hole 81.

For example, the area of the orthographic projection of the second via hole 82 on the plane of the base substrate 1 may be greater than the area of the orthographic projection of the first via hole 81 on the plane of the base substrate 1. When forming the via hole 8, the third insulating layer 12 may be etched first to form the second via hole 82, and the second insulating layer 10 may be etched to form the first via hole 81. It can be understood that desirable contact between the first light-blocking part 61 and the first part 51 needs to be ensured. In addition, the second insulating layer 10 and the third insulating layer 12 may be between the first light-blocking part 61 and the first part 51 of the power supply voltage signal line 5. If the hole is punched at one time, a deep hole may need to be punched. In the present disclosure, the hole may be punched twice, such that there is no need to punch a deep hole at one time. In the present disclosure, the area of the second via hole 82 may be greater than the area of the first via hole 81. On the one hand, there is no need to punch hole excessively deep at one time; on the other hand, desirable contact between the first light-blocking part 61 and the first part 51 may be ensured.

Figure 5:
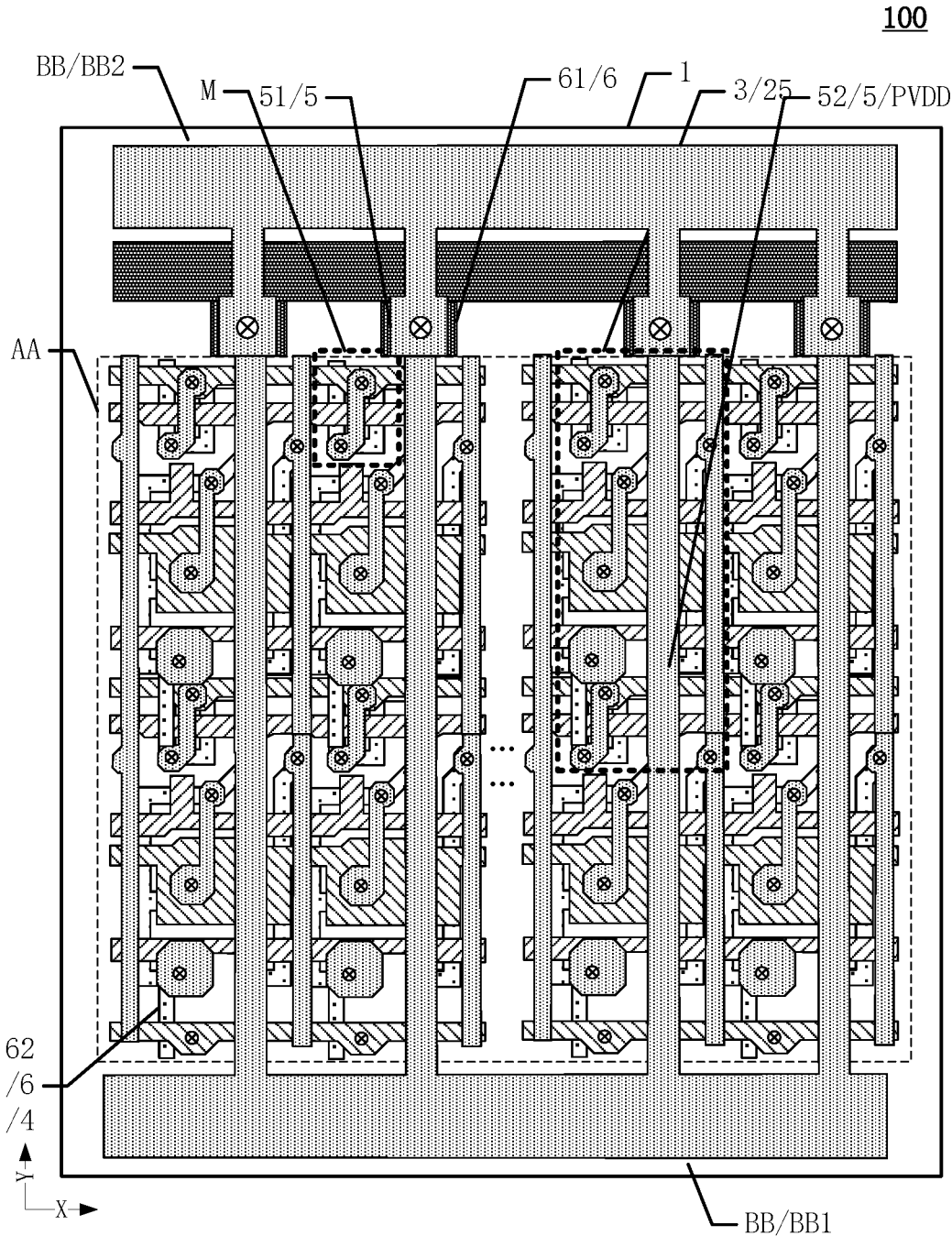
FIG. 5 illustrates another planar structural schematic of a display panel according to various embodiments of the present disclosure.
Figure 6:
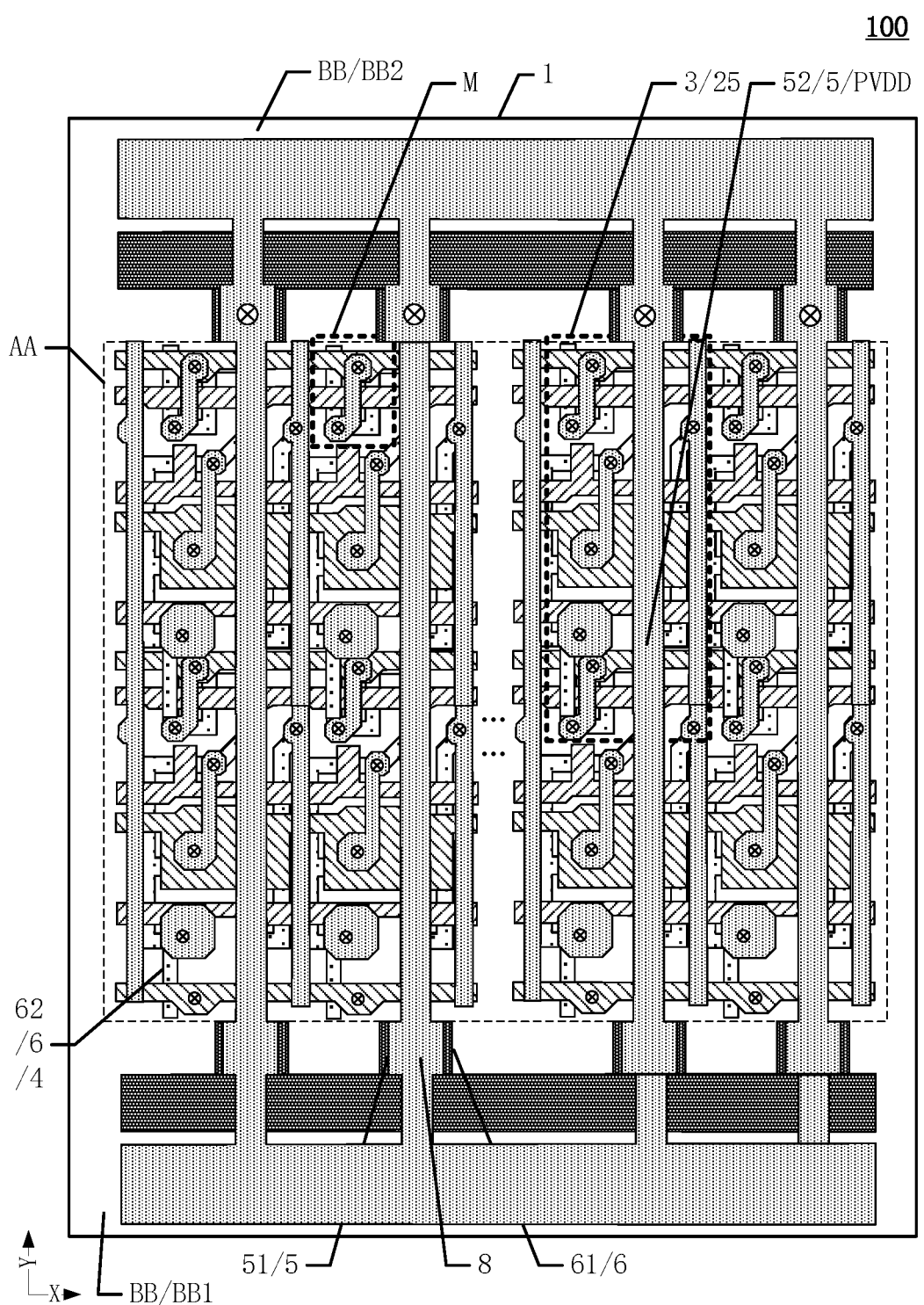
FIG. 6 illustrates another planar structural schematic of a display panel according to various embodiments of the present disclosure.

In some optional embodiments, referring to FIGS. 1, 5 and 6, FIG. 5 illustrates another planar structural schematic of the display panel according to various embodiments of the present disclosure; and FIG. 6 illustrates another planar structural schematic of the display panel according to various embodiments of the present disclosure. The non-display region BB may include the upper frame BB2 and the lower frame BB1 which are disposed to be opposite with each other; and the first light-blocking part 61 may be on the upper frame BB2 and/or the lower frame BB1.

In FIG. 1, the first light-blocking part 61 may be on the lower frame BB1, and the position where the first light-blocking part 61 is connected to the power supply voltage signal line 5 may be on the lower frame BB1. In FIG. 5, the first light-blocking part 61 may be on the upper frame BB2; and the position where the first light-blocking part 61 is connected to the power supply voltage signal line 5 may be on the upper frame BB2. In FIG. 6, the first light-blocking parts 61 may be on the upper frame BB2 and the lower frame BB1; and the positions where the first light-blocking parts 61 are connected to the power supply voltage signal lines 5 may be on the upper frame BB2 and the lower frame BB1. In such way, the opening area of the sub-pixel 25 in the display region may not be occupied, and the opening area of the display panel 100 may be increased.

In some optional embodiments, referring to FIGS. 1, 3, 5, 6 and 7, FIG. 7 illustrates another planar structural schematic of the display panel according to various embodiments of the present disclosure; and the first light-blocking part 61 may be connected to the second light-blocking part 62, or the first light-blocking part 61 and the second light-blocking part 62 may be insulated from each other.

Figure 7:
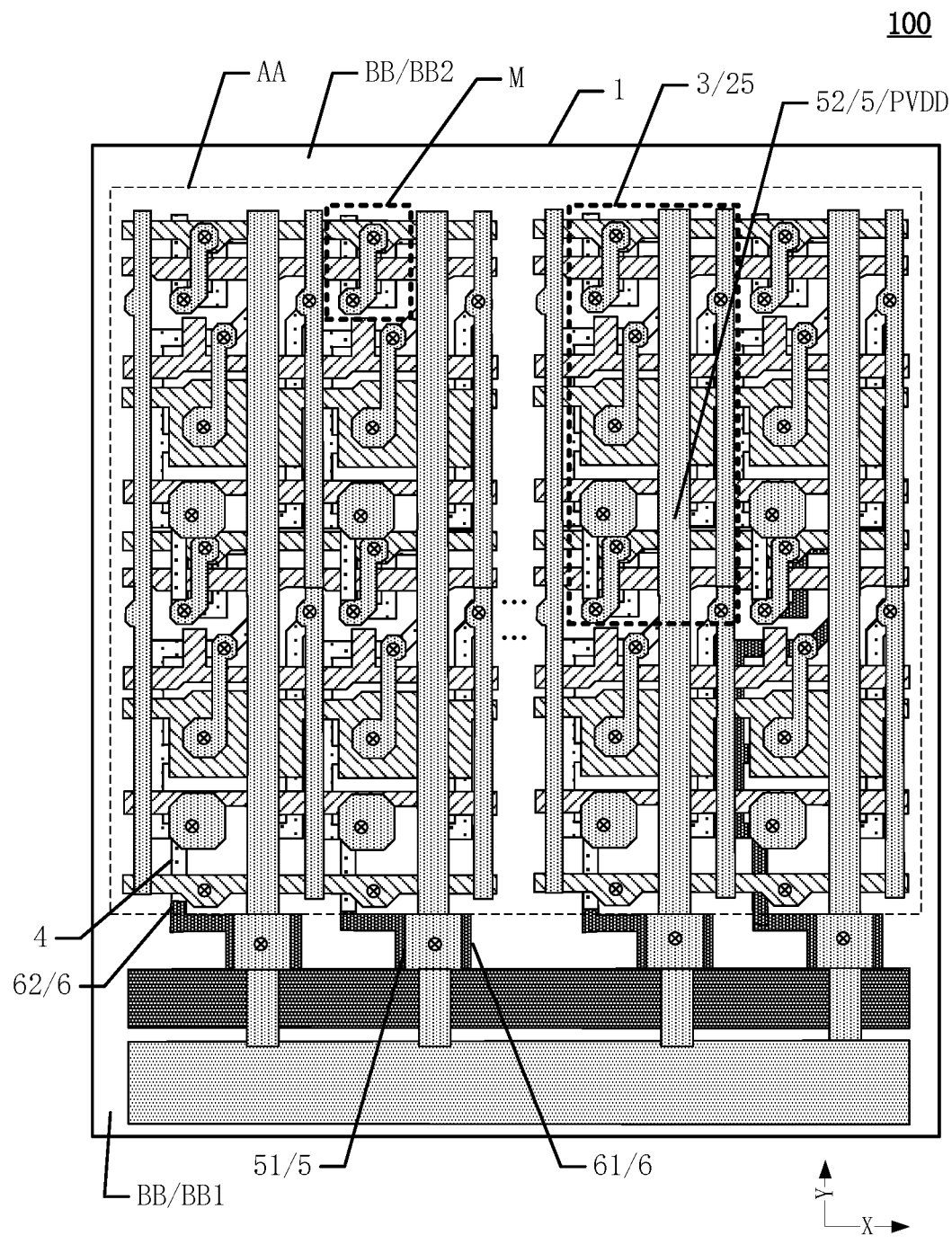
FIG. 7 illustrates another planar structural schematic of a display panel according to various embodiments of the present disclosure.

In FIGS. 1, 3, 5 and 6, the first light-blocking part 61 and the second light-blocking part 62 may be insulated from each other. That is, the first light-blocking part 61 may be not connected to the second light-blocking part 62. In FIG. 7, the first light-blocking part 61 may be connected to the second light-blocking part 62. The first light-blocking part 61 may be only on the lower frame BB1 as an example for illustration in FIG. 7. The first light-blocking part 61 may also be on the upper frame BB2, or the first light-blocking parts 61 may be on the upper frame BB2 and the lower frame BB1, which may not be shown in drawings.

Optionally, the plurality of second light-blocking parts 62 in the display region AA may be insulated from each other; that is, the plurality of second light-blocking parts 62 may be not connected to each other. Obviously, the plurality of second light-blocking parts 62 in the display region AA may also be connected to each other. In FIGS. 1, 3, 5, 6 and 7, the plurality of second light-blocking parts 62 may be insulated from each other only as an example for illustration.

When the first light-blocking part 61 and the second light-blocking part 62 are insulated from each other, the first light-blocking part 61 and the power supply voltage signal line 5 may be connected in parallel through the via hole 8 to reduce the resistance of the power supply voltage signal line 5. The voltage difference between the power supply voltage transmitted to the end of the power supply voltage signal line 5 and the power supply voltage transmitted to the beginning of the power supply voltage signal line 5 may decrease, which may be beneficial for improving display uniformity. In addition, reducing the resistance of the power supply voltage signal line 5 may also reduce the power consumption of the display panel 100. When the first light-blocking part 61 and the second light-blocking part 62 are connected to each other, the first light-blocking part 61 and the second light-blocking part 62 may be connected in parallel with the power supply voltage signal line 5 after being connected in series, and the resistance of the power supply voltage signal line 5 may also be reduced. The voltage difference between the power supply voltage transmitted to the end of the power supply voltage signal line 5 and the power supply voltage transmitted to the beginning of the power supply voltage signal line 5 may decrease, which may be beneficial for improving display uniformity. In addition, reducing the resistance of the power supply voltage signal line 5 may also reduce the power consumption of the display panel 100.

Figure 8:
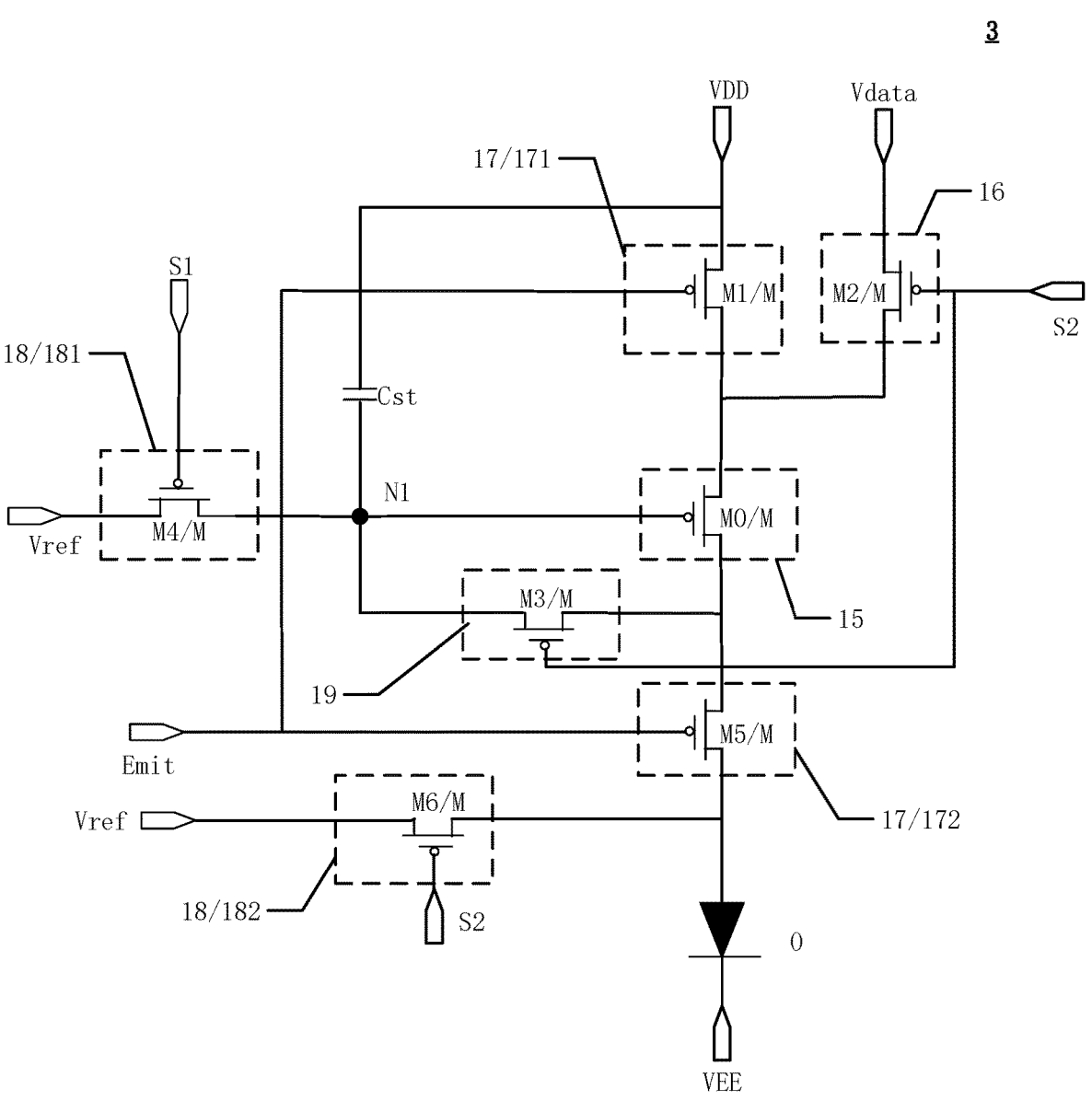
FIG. 8 illustrates a schematic of a drive circuit according to various embodiments of the present disclosure.

In some optional embodiments, referring to FIGS. 1 and 8, FIG. 8 illustrates a schematic of a drive circuit according to various embodiments of the present disclosure. The display panel 100 may include a plurality of light-emitting elements O. The drive circuit 3 may include a drive module 15, a data write module 16, a light-emitting control module 17, a reset module 18, and a storage capacitor Cst.

The drive module 15 may be configured to generate a drive current to drive the light-emitting element O to emit light.

The data write module 16 may be configured to selectively provide data signals for the drive module 15.

The light-emitting control module 17 may be configured to selectively allow the light-emitting element O to enter the light-emitting stage, and the input terminal of the light-emitting control module 17 may be electrically connected to the first power supply voltage signal line PVDD.

The reset module 18 may be configured to reset the control terminal of the drive module 15.

The storage capacitor Cst may be configured to maintain the potential of the control terminal of the drive module 15.

The light-emitting element O may include an anode and a cathode; and the cathode of the light-emitting element O may be electrically connected to the second power supply voltage signal line.

The power supply voltage signal line 5 may be the first power supply voltage signal line PVDD or the second power supply voltage signal line.

For example, in FIG. 8, the drive circuit 3 may be 7T1C, that is, the drive circuit 3 may exemplarily include 7 transistors M and 1 storage capacitor Cst. The drive circuit 3 may include the light-emitting control module 17. The light-emitting control module 17 may include a first light-emitting control module 171 and a second light-emitting control module 172. The first light-emitting control module 171 may include a first transistor M1. The control terminal of the first transistor M1 may be electrically connected to the input terminal of the light-emitting signal, the first terminal of the first transistor M1 may be electrically connected to the first power signal terminal VDD, and the second terminal of the first transistor M1 may be electrically connected to the first terminal of the drive module 15. The second light-emitting control module 172 may include a fifth transistor M5. The control terminal of the fifth transistor M5 may be electrically connected to the light-emitting signal input terminal Emit, the first terminal of the fifth transistor M5 may be electrically connected to the second terminal of the drive transistor M0 and the second terminal of the third transistor M3, and the second terminal of the fifth transistor M5 may be electrically connected to the anode of the light-emitting element O. The data write module 16 may include a second transistor M2. The control terminal of the second transistor M2 may be electrically connected to the second scan signal input terminal S2, the first terminal of the second transistor M2 may be electrically connected to the data signal input terminal Vdata, and the second terminal of the second transistor M2 may be electrically connected to the first terminal of the drive transistor M0. The drive module 15 may include a drive transistor M0. The control terminal of the drive transistor M0 may be electrically connected to the second terminal of a fourth transistor M4, and the first terminal of the drive transistor M0 may be electrically connected to the second terminal of the first transistor M1 and the second terminal of the second transistor M2. The drive circuit 3 may further include a threshold compensation module 19. The threshold compensation module 19 may include the third transistor M3. The control terminal of the third transistor M3 may be electrically connected to the second scan signal input terminal S2, the first terminal of the third transistor M3 may be electrically connected to the second terminal of the fourth transistor M4 and the second terminal of the storage capacitor Cst, and the second terminal of the third transistor M3 may be electrically connected to the second terminal of the drive transistor M0 and the first terminal of the fifth transistor M5. The reset module 18 may include a first reset module 181 and a second reset module 182. The first reset module 181 may include the fourth transistor M4. The control terminal of the fourth transistor M4 may be electrically connected to the first scan signal input terminal S1, the first terminal of the fourth transistor M4 may be electrically connected to the reference voltage signal input terminal Vref, and the second terminal of the fourth transistor M4 may be electrically connected to the control terminal of the drive transistor M. The second reset module 182 may include a sixth transistor M6. The control terminal of the sixth transistor M6 may be electrically connected to the second scan signal input terminal, the first terminal of the sixth transistor M6 may be electrically connected to the reference voltage signal input terminal Vref, and the second terminal of the sixth transistor M6 may be electrically connected to the first terminal of the light-emitting element O. For the light-emitting element O, the first terminal may be electrically connected to the second terminal of the fifth transistor M5 and the second terminal of the sixth transistor M6; and the second terminal may be electrically connected to the second power signal terminal VEE. For the storage capacitor Cst, the first terminal may be electrically connected to the first power signal terminal VDD, and the second terminal may be electrically connected to the control terminal of the drive transistor M0, the first terminal of the third transistor M3, and the second terminal of the fourth transistor M4.

Herein, the first power signal terminal VDD may be electrically connected to the power supply voltage signal line 5 in FIG. 1. The power supply voltage signal line 5 may be the first power supply voltage signal line PVDD or the second power supply voltage signal line (not shown in drawings). Optionally, the first power supply voltage signal line PVDD may be the power supply voltage signal line 5 in FIG. 1 for transmitting a high voltage to the drive circuit 3. Obviously, the power supply voltage signal line 5 may also be the second power supply voltage signal line for transmitting a low voltage for the drive circuit 3. The second power signal terminal VEE in FIG. 8 may be electrically connected to the second power supply voltage signal line, which is not shown in FIG. 1.

In the present disclosure, the power supply voltage signal line 5 may be the first power supply voltage signal line PVDD or the second power supply voltage signal line. Therefore, the resistance of the first power supply voltage signal line PVDD or the second power supply voltage signal line may be reduced, and the voltage difference between the power supply voltage transmitted to the end of the first power supply voltage signal line PVDD and the power supply voltage transmitted to the beginning of the second power supply voltage signal line may be reduced, which may be beneficial for improving display uniformity. In addition, reducing the resistance of the first power supply voltage signal line PVDD or the second power supply voltage signal line can also reduce the power consumption of the display panel 100.

Figure 10:
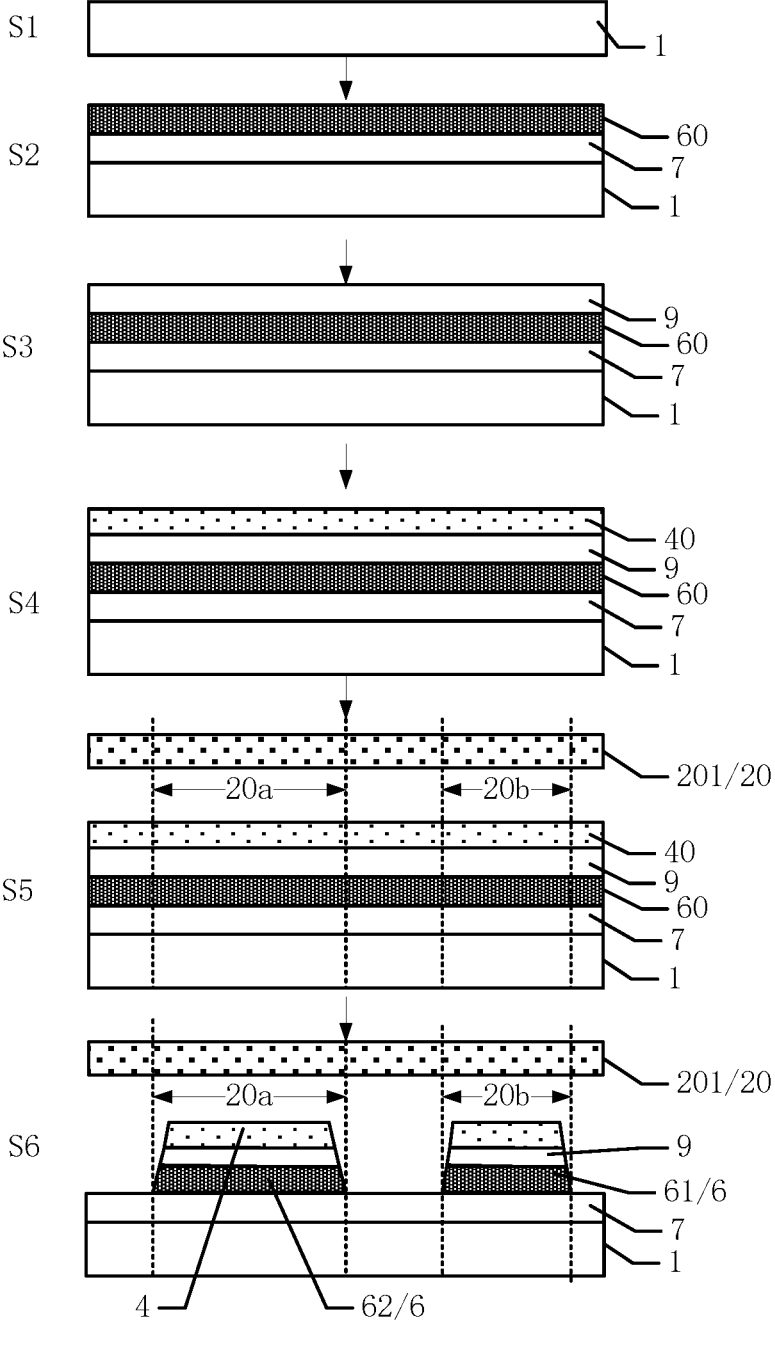
FIG. 10 illustrates cross-sectional views in a flowchart of a formation method corresponding to FIG. 9.

Based on the same inventive concept, the present disclosure also provides a formation method of the display panel. Referring to FIGS. 9-10, FIG. 9 illustrates a flowchart of a formation method of the display panel according to various embodiments of the present disclosure; and FIG. 10 illustrates cross-sectional views in the flowchart of the formation method corresponding to FIG. 9. The cross-sectional view of FIG. 10 may correspond to the A-A' region in FIG. 1. The method may include following exemplary steps.

At S1, the base substrate may be provided.

At S2, the light-blocking layer may be formed on the base substrate.

At S3, the first insulating layer may be formed on the side of the light-blocking layer away from the base substrate.

At S4, an active layer may be formed on the side of the first insulating layer away from the base substrate.

At S5, a mask layer may be provided, and the display panel may be divided into a first sub-region and a second sub-region, where a spacing may be between the first sub-region and the second sub-region.

At S6, the active layer, the first insulating layer and the light-blocking layer may be etched using a same mask layer, the active layer in the first sub-region may be retained as the semiconductor of the transistor, and the light-blocking layer may be divided into the first light-blocking part and the second light-blocking part. Along the direction perpendicular to the plane of the base substrate, the semiconductor of each transistor may be at least partially overlapped with the second light-blocking part.

For example, at S2, optionally, the light-blocking layer 60 may be deposited on the base substrate 1 by using a sputtering device (Sputter), and the light-blocking layer 60 may be disposed as an entire layer. Optionally, before forming the light-blocking layer 60, the buffer layer 7 may be formed on the base substrate 1, and the light-blocking layer 60 may be deposited after the buffer layer 7 is formed. The mask layer may not be needed in such step; and the buffer layer 7 and the light-blocking layer 60 may each be deposited as an entire layer.

At S3, the first insulating layer 9 may be formed on the side of the light-blocking layer 60 away from the base substrate 1. The first insulating layer 9 may be deposited by a chemical vapor deposition (CVD) manner. Optionally, silicon oxide ($SiO_x$) and silicon nitride ($SiN_x$) may be alternately deposited to form the first insulating layer 9. The mask layer may not be needed in such step, and alternately deposited silicon oxide ($SiO_x$) and silicon nitride ($SiN_x$) may be each deposited as an entire layer.

At S4, optionally, the active layer 40 may be formed on the first insulating layer 9 by using a sputtering device (Sputter), and the active layer 40 may be formed as an entire layer. In such step, the mask layer may not be needed, and the active layer 40 may be deposited as an entire layer.

At S5, the mask layer 20 may be provided, where the mask layer 20 may be the first mask layer 201. The display panel 100 may be divided into the first sub-region 20a and the second sub-region 20b. A spacing may be between the first sub-region 20a and the second sub-region 20b. Herein, the first sub-region 20a may correspond to the region where the first light-blocking part 61 is to be formed, and the second sub-region 20b may correspond to the region where the second light-blocking part 62 is to be formed.

At S6, the active layer 40, the first insulating layer 9 and the light-blocking layer 60 may be etched using the same mask layer 20, the active layer 40 in the first sub-region 20a may be retained as the semiconductor 4 of the transistor M, and the light-blocking layer 60 may be divided into the first light-blocking part 61 and the second light-blocking part 62. Along the direction perpendicular to the plane of the base substrate 1, the semiconductor 4 of each transistor M may be at least partially overlapped with the second light-blocking part 62. For example, a photoresist 22 may be coated on the active layer 40, and a digital exposure unit may be used to expose the photoresist 22. The digital exposure unit may expose the photoresist 22 in the first sub-region 20a according to received specific values of the areas of the orthographic projections of the active layer 40, the first insulating layer 9 and the light-blocking layer 60 on the base substrate 1. Meanwhile, the digital exposure unit may also expose the photoresist 22 of the second sub-region 20b according to received specific values of the areas of the orthographic projections of the active layer 40, the first insulating layer 9 and the light-blocking layer 60 on the base substrate 1. After exposure, patterning may be performed by developing and etching processes, and the photoresist 22 on the surface of the active layer 40 may be peeled off. The active layer 40, the first insulating layer 9 and the light-blocking layer 60 corresponding to parts other than the first sub-region 20a and the second sub-region 20b may be all etched away. Etching the active layer 40, the first insulating layer 9, and the light-blocking layer 60 corresponding to the first sub-region 20a and etching the active layer 40, the first insulating layer 9 and the light-blocking layer 60 corresponding to the second sub-region 20b may be performed simultaneously. In such way, the active layer 40 may be etched to form the first light-blocking part 61 and the second light-blocking part 62; and the active layer 40 in the first sub-region 20a may be retained as the semiconductor 4 of the transistor M. Therefore, the semiconductor 4 of each transistor M may be overlapped with the second light-blocking part 62.

In the existing technology, the light-blocking layer may be formed first, and one mask layer may be used to etch the light-blocking layer separately to obtain the first light-blocking part and the second light-blocking part; the first insulating layer and the active layer may be formed; and another mask layer may be used to etch the active layer. Therefore, in the existing technology, two mask layers may be needed to etch the light-blocking layer and the active layer, which increases the formation cost. However, in the present disclosure, when the light-blocking layer 60 is etched to form the first light-blocking part 61 and the second light-blocking part 62, the light-blocking layer 60 and the active layer 40 may be etched using the same mask layer 20, which may save one mask layer 20. In the present disclosure, the light-blocking layer 60 and the active layer 40 may be simultaneously etched with only one mask layer 20, which reduces the formation cost, simplifies the formation process and does not need to etch the light-blocking layer 60 and the active layer 40 separately.

Figure 12:
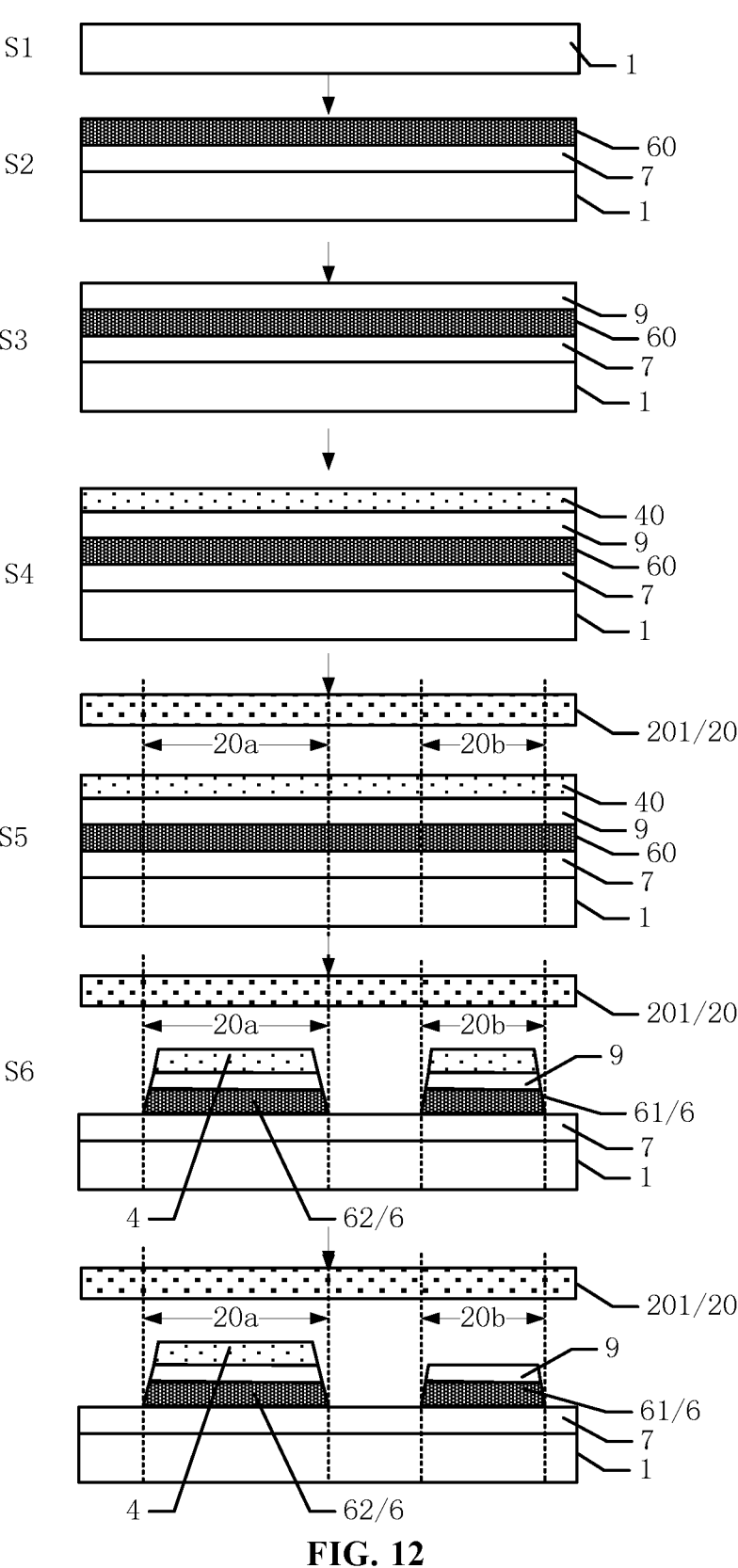
FIG. 12 illustrates cross-sectional views in a flowchart of a formation method corresponding to FIG. 11.

In some optional embodiments, referring to FIGS. 11-12, FIG. 11 illustrates another flowchart of a formation method of the display panel according to various embodiments of the present disclosure; and FIG. 12 illustrates cross-sectional views in the flowchart of the formation method corresponding to FIG. 11. The sectional view of FIG. 12 may correspond to the A-A' region in FIG. 1. Etching the active layer, the first insulating layer and the light-blocking layer using the same mask layer at S6 may also include removing the active layer in the second sub-region and retaining the first insulating layer and the light-blocking layer in the second sub-region.

For example, at S6, the same mask layer 20 may be used to etch the active layer 40, the first insulating layer 9 and the light-blocking layer 60; the photoresist 22 may be coated on the active layer 40; and the photoresist 22 may be exposed using a digital exposure unit. The digital exposure unit may expose the photoresist 22 in the first sub-region 20a according to received specific values of the areas of the orthographic projections of the active layer 40, the first insulating layer 9 and the light-blocking layer 60 on the base substrate 1. Meanwhile, the digital exposure unit may also expose the photoresist 22 in the second sub-region 20b according to received specific values of the areas of the orthographic projections of the active layer 40, the first insulating layer 9 and the light-blocking layer 60 on the base substrate 1. After exposure, patterning may be performed by developing and etching processes, and the photoresist 22 on the surface of the active layer 40 may be peeled off. The active layer 40, the first insulating layer 9 and the light-blocking layer 60 corresponding to parts other than the first sub-region 20a and the second sub-region 20b may be all etched away. Etching the active layer 40, the first insulating layer 9, and the light-blocking layer 60 corresponding to the first sub-region 20a, and etching the active layer 40, the first insulating layer 9 and the light-blocking layer 60 corresponding to the second sub-region 20b may be performed simultaneously. The active layer 40 may be etched to form the first light-blocking part 61 and the second light-blocking part 62; and the active layer 40 in the first sub-region 20a may be retained as the semiconductor 4 of the transistor M. In such way, the semiconductor 4 of each transistor M may be overlapped with the second light-blocking part 62. Meanwhile, still using the same mask layer 20, that is, the first mask layer 201 in FIG. 12, the active layer 40 in the second sub-region 20b may be removed; and the first insulating layer 9 and the light-blocking layer 60 in the second sub-region 20b may be retained. Herein, the light-blocking layer 60 in the second sub-region 20b may be the first light-blocking part 61.

After removing the active layer 40 in the second sub-region 20b, the thickness of the film layer between the first light-blocking part 61 and the power supply voltage signal line 5 may be reduced. If the first light-blocking part 61 is electrically connected to the power supply voltage signal line 5, a hole may need to be formed by punching the film layer between the first light-blocking part 61 and the power supply voltage signal line 5, such that the first light-blocking part 61 may be electrically connected to the power supply voltage signal line 5 through the via hole 8. The less the film layers between the first light-blocking part 61 and the power supply voltage signal line 5 are, the easier the hole is formed by punching. In one embodiment, removing the active layer 40 in the second sub-region 20b may not require additionally providing the mask layer 20, which may reduce formation cost.

Figure 14:
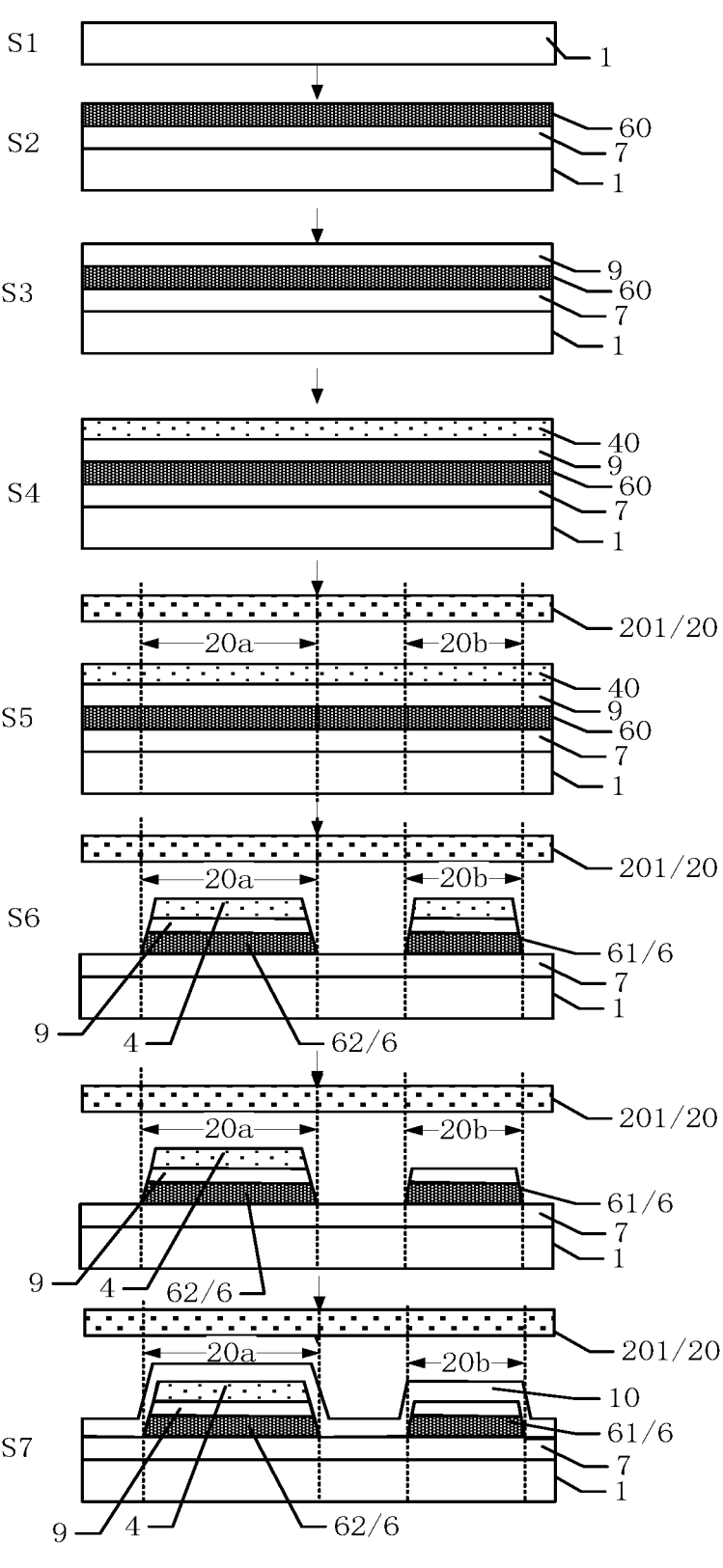
FIG. 14 illustrates cross-sectional views in a flowchart of a formation method corresponding to FIG. 13.

In some optional embodiments, referring to FIGS. 13-14, FIG. 13 illustrates another flowchart of a formation method of the display panel according to various embodiments of the present disclosure; and FIG. 14 illustrates cross-sectional views in the flowchart of the formation method corresponding to FIG. 13. The sectional view of FIG. 14 may correspond to the A-A' region in FIG. 1. After removing the active layer in the second sub-region, the present disclosure may further include S7: forming the second insulating layer, where the second insulating layer may cover the first sub-region, the second sub-region and the spacing between the first sub-region and the second sub-region.

In one embodiment, entire second insulating layer 10 may be formed. The second insulating layer 10 may cover the first insulating layer 9 in the first sub-region 20a and the second sub-region 20b and cover the spacing between the first sub-region 20a and the second sub-region 20b. Optionally, the second insulating layer 10 may also cover the region other than the first sub-region 20a, the second sub-region 20b, and the spacing between the first sub-region 20a and the second sub-region 20b. The second insulating layer 10 may be deposited as an entire layer.

Figure 16:
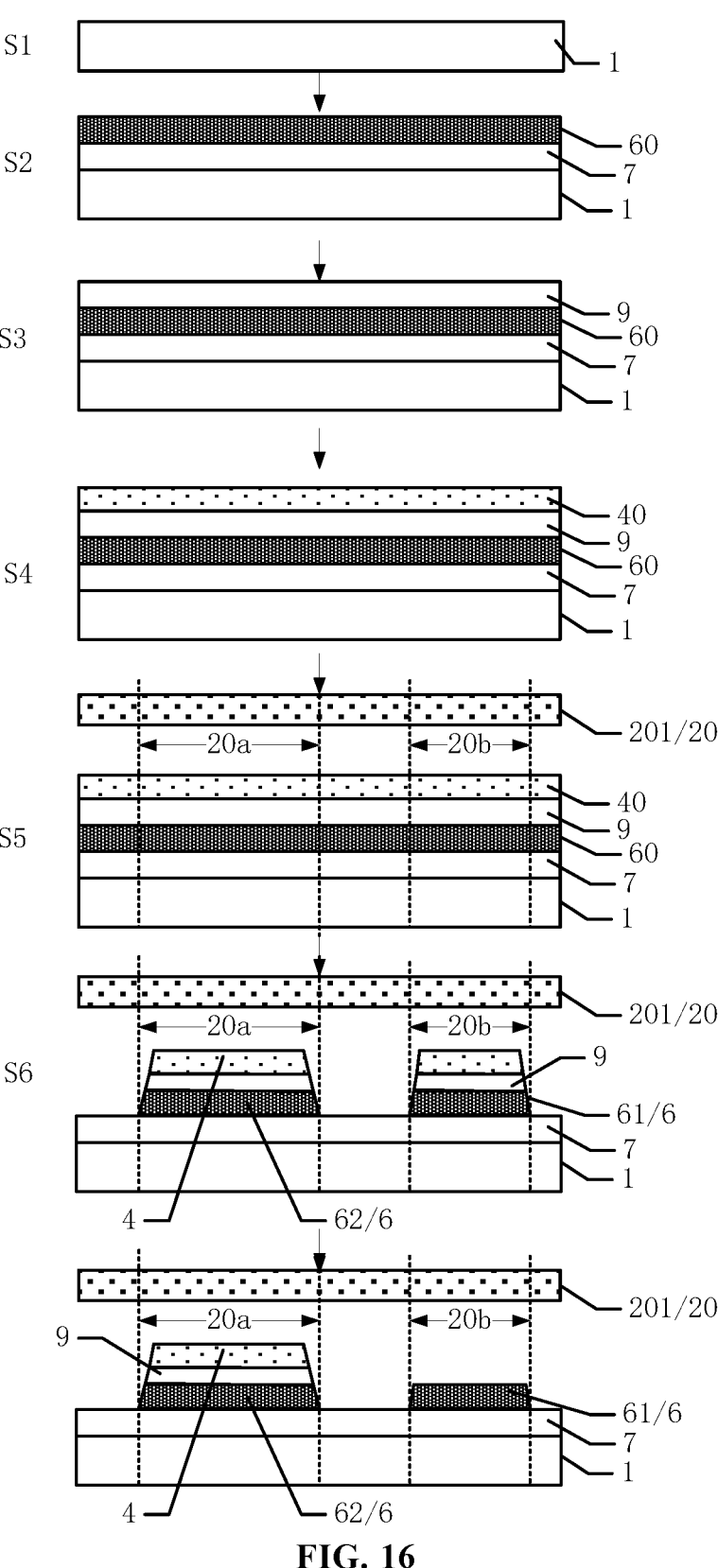
FIG. 16 illustrates cross-sectional views in a flowchart of a formation method corresponding to FIG. 15.

In some optional embodiments, referring to FIGS. 15-16, FIG. 15 illustrates another flowchart of a formation method of a display panel according to various embodiments of the present disclosure; and FIG. 16 illustrates cross-sectional views in the flowchart of the formation method corresponding to FIG. 15. The cross-sectional view of FIG. 16 may correspond to the A-A' region in FIG. 1. At S6 of simultaneously etching the active layer, the first insulating layer and the light-blocking layer, the method may further include removing the active layer and the first insulating layer in the second sub-region and retaining the light-blocking layer in the second sub-region as the first light-blocking part.

For example, the same mask layer 20 may be used to etch the active layer 40, the first insulating layer 9 and the light-blocking layer 60; the photoresist 22 may be coated on the active layer 40; and the photoresist 22 may be exposed using a digital exposure unit. The digital exposure unit may expose the photoresist 22 in the first sub-region 20a according to received specific values of the areas of the orthographic projections of the active layer 40, the first insulating layer 9 and the light-blocking layer 60 on the base substrate 1. Meanwhile, the digital exposure unit may also expose the photoresist 22 in the second sub-region 20b according to received specific values of the areas of the orthographic projections of the active layer 40, the first insulating layer 9 and the light-blocking layer 60 on the base substrate 1. After exposure, patterning may be performed by developing and etching processes, and the photoresist 22 on the surface of the active layer 40 may be peeled off. The active layer 40, the first insulating layer 9 and the light-blocking layer 60 corresponding to parts other than the first sub-region 20a and the second sub-region 20b may be all etched away. Etching the active layer 40, the first insulating layer 9, and the light-blocking layer 60 corresponding to the first sub-region 20a, and etching the active layer 40, the first insulating layer 9 and the light-blocking layer 60 corresponding to the second sub-region 20b may be performed simultaneously. The active layer 40 may be etched to form the first light-blocking part 61 and the second light-blocking part 62; and the active layer 40 in the first sub-region 20a may be retained as the semiconductor 4 of the transistor M. In such way, the semiconductor 4 of each transistor M may be overlapped with the second light-blocking part 62. Meanwhile, still using the same mask layer 20, that is, the first mask layer 201 in FIG. 16, the active layer 40 and the first insulating layer 9 in the second sub-region 20b may be removed; and the light-blocking layer 60 in the second sub-region 20b may be retained. Herein, the light-blocking layer 60 in the second sub-region 20b may be the first light-blocking part 61.

After removing the active layer 40 and the first insulating layer 9 in the second sub-region 20b, the thickness of the film layer between the first light-blocking part 61 and the power supply voltage signal line 5 may be reduced. If the first light-blocking part 61 is electrically connected to the power supply voltage signal line 5, a hole may need to be formed by punching the film layer between the first light-blocking part 61 and the power supply voltage signal line 5, such that the first light-blocking part 61 may be electrically connected to the power supply voltage signal line 5 through the via hole 8. The less the film layers between the first light-blocking part 61 and the power supply voltage signal line 5 are, the easier the hole is formed by punching. In one embodiment, removing the active layer 40 and the first insulating layer 9 in the second sub-region 20b may not require additionally providing the mask layer 20, which may reduce formation cost.

Figure 18:
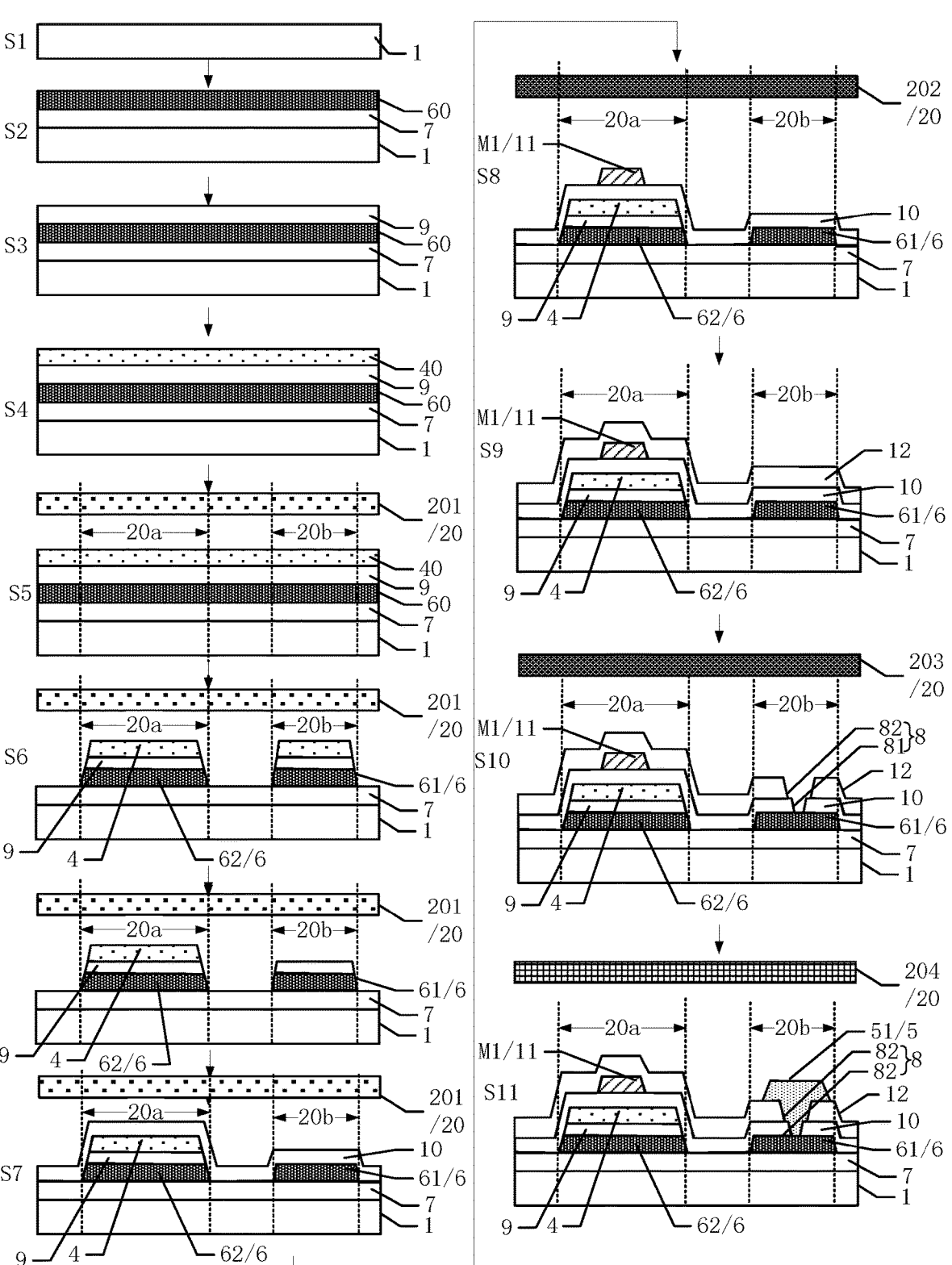
FIG. 18 illustrates cross-sectional views in a flowchart of a formation method corresponding to FIG. 17.

In some optional embodiments, referring to FIGS. 17-18, FIG. 17 illustrates another flowchart of a formation method of a display panel according to various embodiments of the present disclosure; and FIG. 18 illustrates cross-sectional views in the flowchart of the formation method corresponding to FIG. 17. The cross-sectional view of FIG. 18 may correspond to the A-A' region in FIG. 1. After simultaneously removing the active layer and the first insulating layer in the second sub-region, the method may further include following exemplary steps.

At S7, the second insulating layer may be formed to cover the first sub-region, the second sub-region and the spacing between the first sub-region and the second sub-region.

At S8, the first metal layer may be formed, patterning may be performed on the first metal layer, and the first metal layer in the first sub-region may be retained to form the gate electrode of the transistor.

At S9, the third insulating layer may be formed on the side of the gate electrode away from the substrate, where the third insulating layer may cover the gate electrode, the second sub-region, and the spacing between the first sub-region and the second sub-region.

At S10, the third insulating layer and the second insulating layer may be etched sequentially to form the second via hole passing through the third insulating layer and the first via hole passing through the second insulating layer.

At S11, a patterned power supply voltage signal line may be formed on the side of the third insulating layer away from the base substrate; and the power supply voltage signal line may be electrically connected to the first light-blocking part.

At S8, the first metal layer M1 may be formed, patterning may be performed on the first metal layer M1, and the first metal layer M1 in the first sub-region 20a may be retained to form the gate electrode 11 of the transistor M. For example, entire layer of the first metal layer M1 may be formed on the side of the second insulating layer 10 away from the base substrate 1, and then entire surface of the photoresist 22 may be coated on the first metal layer M1; the second mask layer 202 may be configured to expose and develop entire surface of the photoresist 22, exposed photoresist 22 may be ashed and removed during the development process, while unexposed photoresist 22 may be still retained after development; next, the first metal layer M1 not covered by the photoresist 22 may be etched away to obtain the gate electrode 11.

At S9, the third insulating layer 12 may be formed on the side of the gate electrode 11 away from the base substrate 1; and the third insulating layer 12 may be deposited as an entire layer. The material of the third insulating layer 12 may not be described in detail herein.

At S10, the third insulating layer 12 and the second insulating layer 10 may be sequentially etched to form the second via hole 82 passing through the third insulating layer 12 and the first via hole 81 passing through the second insulating layer 10. For example, in such step, the third mask layer 203 may be provided to have a fully light-transmitting region 213. The third insulating layer 12 below the fully light-transmitting region 213 may be etched to form the second via hole 82, and the second insulating layer 10 below the fully light-transmitting region 213 may be etched away to form the first via hole 81 sequentially.

At S11, after the first via hole 81 and the second via hole 82 are formed, the power supply voltage signal line 5 may be formed on the side of the third insulating layer 12 away from the base substrate 1, that is, the power supply voltage signal line 5 may be electrically connected to the first light-blocking part 61. An optional process for forming the power supply voltage signal line 5 may be depositing the second metal layer M2 on the side of the third insulating layer 12 away from the base substrate 1 as an entire layer, coating the photoresist 22 on the side of the second metal layer M2 away from the base substrate 1, using the fourth mask layer 204 to expose and develop entire surface of the photoresist 22, where exposed photoresist 22 may be ashed and removed during development while unexposed photoresist 22 may be still retained after development, and etching away the second metal layer M2 which is not covered by the photoresist 22 to obtain the power supply voltage signal line 5.

In one embodiment, the electrical connection between the first light-blocking part 61 and the power supply voltage signal line 5 may be realized through above exemplary steps.

Figure 20:
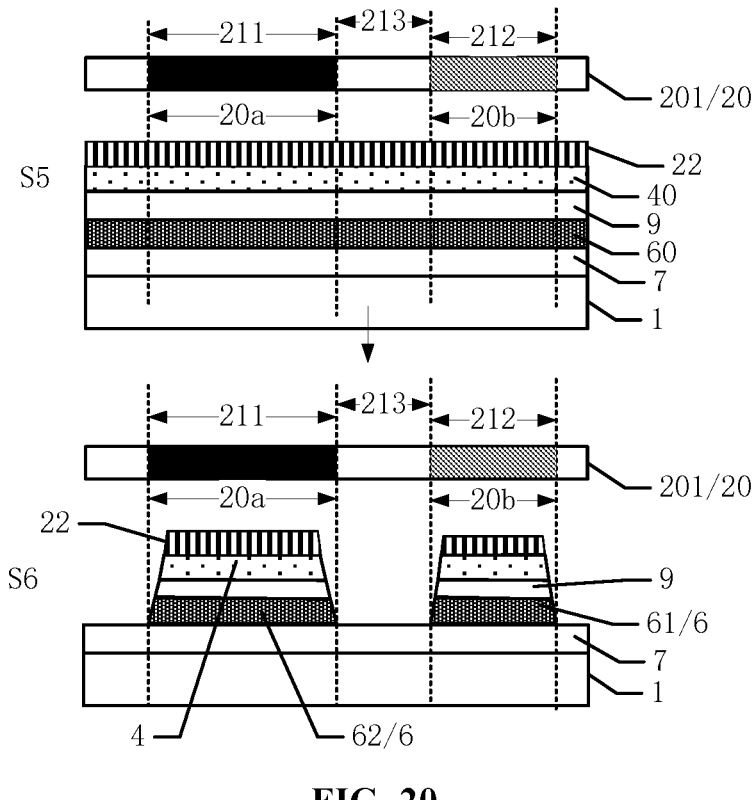
FIG. 20 illustrates cross-sectional views corresponding to S5 and S6.

In some optional embodiments, referring to FIGS. 19-20, FIG. 19 illustrates another flowchart of a formation method of the display panel according to various embodiments of the present disclosure; and FIG. 20 illustrates cross-sectional views corresponding to S5 and S6. The cross-sectional view of FIG. 20 may correspond to the A-A' region in FIG. 1. S6 of using the same mask layer to etch the active layer, the first insulating layer and the light-blocking layer may include following exemplary steps.

Entire surface photoresist 22 may be formed on the side of the active layer away from the base substrate 1.

The mask layer 20 may be used to expose and develop the photoresist 22. The mask layer 20 may include a non-light-transmitting region 211, a partially light-transmitting region 212 and a fully light-transmitting region 213. After the developing process, the photoresist 22 at the position of the fully light-transmitting region 213 may be removed, and the photoresist 22 at the position of the partially light-transmitting region 212 may be thinned. The non-light-transmitting region 211 may correspond to the first sub-region 20a, and the partially light-transmitting region 212 may correspond to the second sub-region 20b.

Corresponding to the spacing between the first sub-region 20a and the second sub-region 20b, the active layer 40, the first insulating layer 9 and the light-blocking layer 60 may be sequentially etched.

For example, in one embodiment, the first mask layer 201 may be HTM (halftone mask layer) only as an example. HTM (half-tone mask layer) may be used to expose and develop entire surface of the photoresist 22. The active layer 40 may be exposed and developed by using the half-tone mask layer 20 with different light transmittance in different regions to pattern the semiconductor 4. Meanwhile, the first light-blocking part 61 and the second light-blocking part 62 under the semiconductor 4 may be also patterned.

After the developing process, the photoresist 22 at the position of the fully light-transmitting region 213 may be removed, and the photoresist 22 at the position of the partially light-transmitting region 212 may be thinned. The non-light-transmitting region 211 may correspond to the first sub-region 20*a*, and the partially light-transmitting region 212 may correspond to the second sub-region 20*b*. For the spacing between the first sub-region 20*a* and the second sub-region 20*b* which corresponds to the fully light-transmitting region 213, the active layer 40, the first insulating layer 9 and the light-blocking layer 60 may be sequentially etched.

In the present disclosure, when the light-blocking layer 60 is etched to form the first light-blocking part 61 and the second light-blocking part 62, the light-blocking layer 60 and the active layer 40 may be etched with the same first mask layer 201, which may save one mask layer 20. In the present disclosure, the light-blocking layer 60 and the active layer 40 may be simultaneously etched with only one mask layer 20, which reduces the formation cost, simplifies the formation process and does not need to etch the light-blocking layer 60 and the active layer 40 separately.

Figure 21:
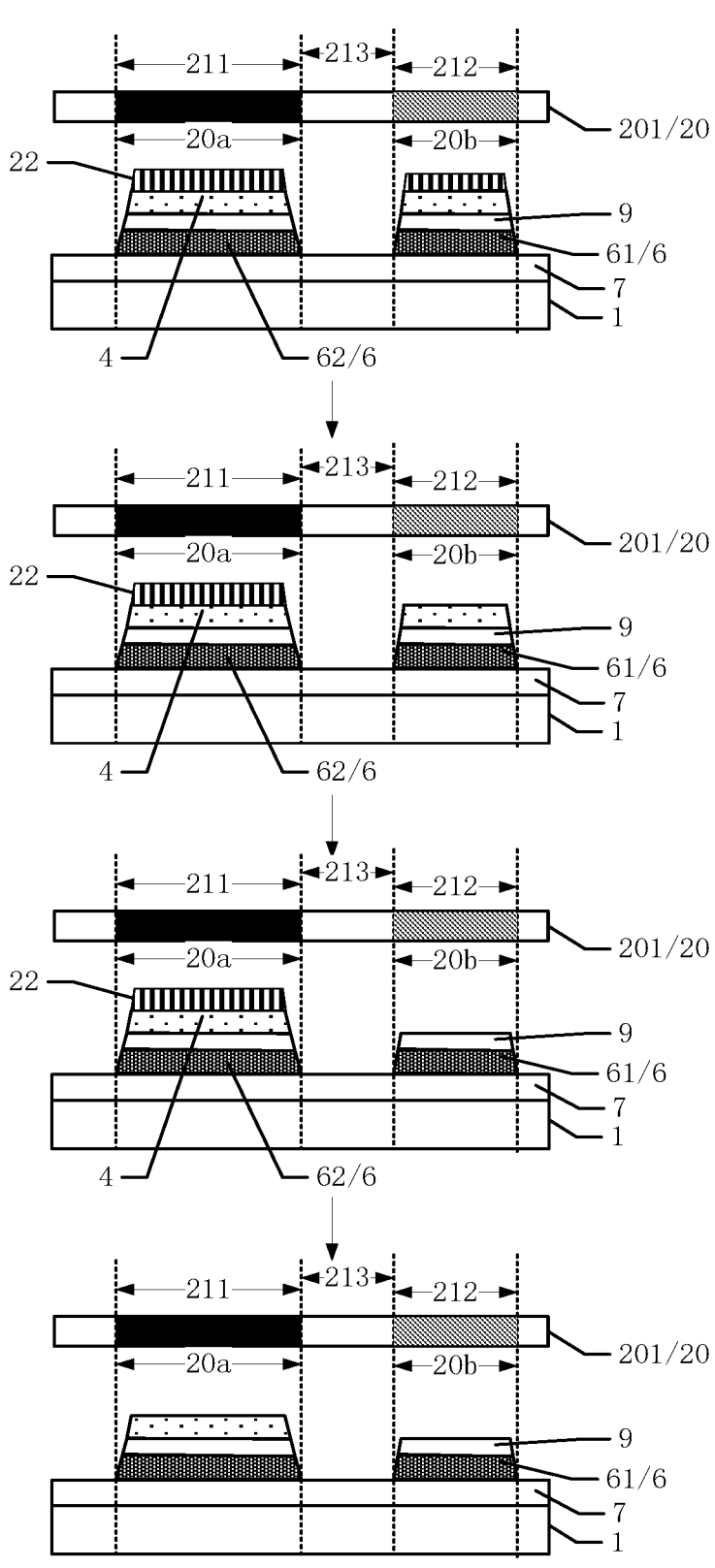
FIG. 21 illustrates another cross-sectional view corresponding to S6.

In some optional embodiments, referring to FIG. 21, FIG. 21 illustrates another cross-sectional view corresponding to S6. The cross-sectional view of FIG. 21 may correspond to the A-A' region in FIG. 1. After etching the active layer, the first insulating layer and the light-blocking layer using the same mask layer, the method may further include following exemplary steps.

The photoresist 22 at the position of the partially light-transmitting region 212 may be removed by ashing.

The active layer 40 at the position of the partially light-transmitting region 212 may be removed by etching.

The photoresist 22 at the position of the non-light-transmitting region 211 may be removed by ashing to obtain the semiconductor 4.

In one embodiment, the photoresist 22 and the active layer 40 above the first light-blocking part 61 may be removed through the first mask layer 201; and the photoresist 22 above the semiconductor 4 may be removed using the first mask layer 201, without replacing the mask layer 20.

Figure 22:
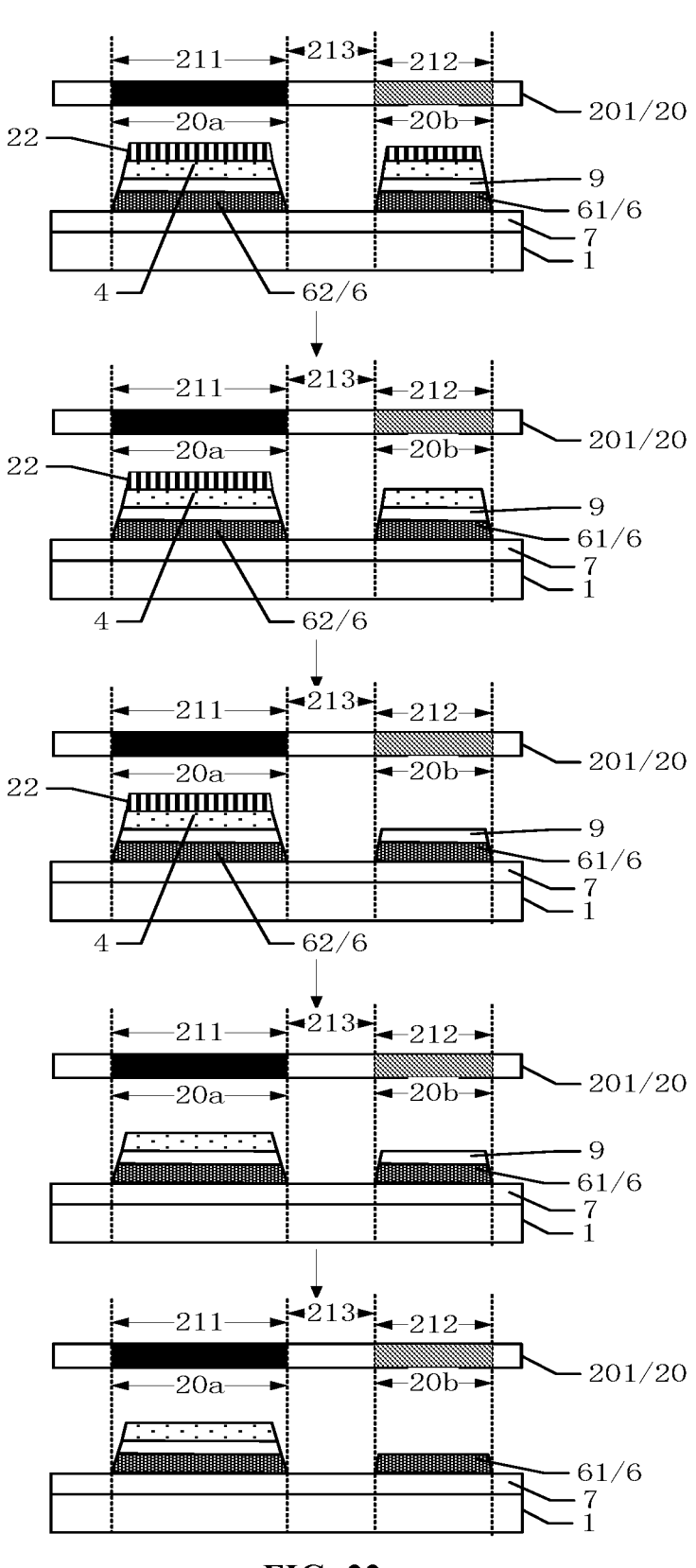
FIG. 22 illustrates another cross-sectional view corresponding to S6.

In some optional embodiments, FIG. 22 illustrates another cross-sectional view corresponding to S6. The cross-sectional view of FIG. 22 may correspond to the A-A' region in FIG. 1. Etching to remove the active layer 40 at the position of the partially light-transmitting region 212 may also include etching to remove the first insulating layer 9 at the position of the partially light-transmitting region 212.

In one embodiment, the first insulating layer 9 above the first light-blocking part 61 may be removed through the first mask layer 201, and the mask layer 20 may not need to be replaced.

Figure 23:
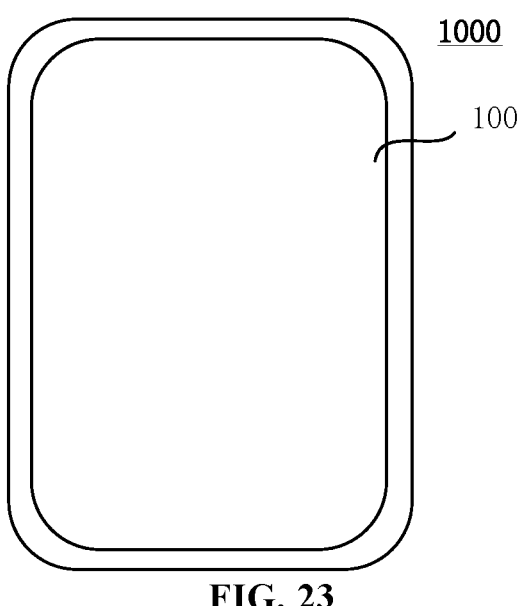
FIG. 23 illustrates a planar structural schematic of a display apparatus according to various embodiments of the present disclosure.

In some optional embodiments, referring to FIG. 23, FIG. 23 illustrates a planar structural schematic of a display apparatus according to various embodiments of the present disclosure. A display apparatus 1000 provided in one embodiment may include the display panel 100 provided in above-mentioned embodiments of the present disclosure. In one embodiment, a mobile phone may be used as an example to illustrate the display apparatus 1000 in FIG. 23. It can be understood that the display apparatus 1000 provided in embodiments of the present disclosure may be a computer, a television, a vehicle-mounted display apparatus and other display apparatuses 1000 with display function, which may not be limited in the present disclosure. The display apparatus 1000 provided in embodiments of the present disclosure may have the beneficial effects of the display panel 100 provided in embodiments of the present disclosure, which may refer to the description of the display panel 100 in above-mentioned embodiments for details and may not be described in detail in one embodiment.

From above-mentioned embodiments, it may be seen that the display panel and its formation method, and the display apparatus provided by the present disclosure may achieve at least following beneficial effects.

In the display panel of the present disclosure, the light-blocking part may be disposed on the side of the semiconductor adjacent to the base substrate, the light-blocking part may include the first light-blocking part and the second light-blocking part, and the first light-blocking part may be electrically connected to the power supply voltage signal line; and along the direction perpendicular to the plane of the base substrate, the semiconductor of each transistor may be at least partially overlapped with the second light-blocking part. On the one hand, the first light-blocking part may be electrically connected to the power supply voltage signal line; the first light-blocking part may be connected in parallel with the power supply voltage signal line; and the total resistance after parallel connection may be less than the resistance before the power supply voltage signal line is not connected in parallel with the first light-blocking part, which may reduce the resistance of the power supply voltage signal line. When the power supply voltage signal is transmitted in the power supply voltage signal line, the resistance of the power supply voltage signal line itself may decrease, such that the voltage drop may be also reduced, and the voltage difference between the power supply voltage transmitted to the end of the power supply voltage signal line and the power supply voltage transmitted to the beginning of the power supply voltage signal line may decrease. According to the light-emitting current formula $Id=k(Vsg-|Vth|)^2=k(PVDD-Vdata-|Vth|)^2$ of the light-emitting element, the light-emitting current of each light-emitting element may be positively correlated with the power supply voltage. If the voltage difference between the power supply voltage transmitted to the end of the power supply voltage signal line and the power supply voltage transmitted to the beginning of the power supply voltage signal line decreases, the light-emitting current difference of the light-emitting element at the end of the power supply voltage signal line and the light-emitting element at the beginning of the power supply voltage signal line may also decrease, and the light-emitting brightness difference of the light-emitting elements may be reduced, thereby being beneficial for improving display uniformity. In addition, reducing the resistance of the power supply voltage signal line may also reduce the power consumption of the display panel. On the other hand, along the direction perpendicular to the plane of the base substrate, the semiconductor of each transistor may be at least partially overlapped with the second light-blocking part. When ambient light irradiates the transistor from the side of the base substrate away from the light-emitting surface of the display panel (i.e., the back side), the second light-blocking part may prevent the light from irradiating each semiconductor, which may prevent each transistor from leakage current, improve the electrical characteristics of each transistor, and improve the display performance of the display panel.

The present disclosure also provides the formation method of the display panel which may include the following exemplary steps. The base substrate may be provided; the light-blocking layer may be formed on the base substrate; the first insulating layer may be formed on the side of the light-blocking layer away from the base substrate; the active layer may be formed on the side of the first insulating layer away from the base substrate; the mask layer may be provided, and the display panel may be divided into the first sub-region and the second sub-region, where the spacing may be between the first sub-region and the second sub-region; and the active layer, the first insulating layer and the light-blocking layer may be etched using the same mask layer, the active layer in the first sub-region may be retained as the semiconductor of the transistor, and the light-blocking layer may be divided into the first light-blocking part and the second light-blocking part. Along the direction perpendicular to the plane of the base substrate, the semiconductor of each transistor may be at least partially overlapped with the second light-blocking part. In the present disclosure, when the light-blocking layer is etched to form the first light-blocking part and the second light-blocking part, the light-blocking layer and the active layer may be etched using the same mask layer, which may save one mask layer. In the existing technology, the light-blocking layer may be formed first, and one mask layer may be used to etch the light-blocking layer separately to obtain the first light-blocking part and the second light-blocking part; and the first insulating layer and the active layer may be formed; and another mask layer may be used to etch the active layer. Therefore, in the existing technology, two mask layers may be needed to etch the light-blocking layer and the active layer, which may increase the formation cost. In the present disclosure, the light-blocking layer and the active layer may be simultaneously etched with only one mask layer, thereby reducing the formation cost.

Although some embodiments of the present disclosure have been described in detail through various embodiments, those skilled in the art should understand that above embodiments may be for illustration only and may not be intended to limit the scope of the present disclosure. Those skilled in the art should understood that modifications may be made to above embodiments without departing from the scope and spirit of the present disclosure. The scope of the present disclosure may be defined by the appended claims.

What is claimed is:

1. A display panel, comprising:
a base substrate;
an array layer on a side of the base substrate, wherein:
   the array layer includes a drive circuit, wherein the drive circuit includes a plurality of transistors, and a transistor of the plurality of transistors includes a semiconductor; and
   the array layer further includes a power supply voltage signal line on a side of the semiconductor away from the base substrate, wherein the power supply voltage signal line transmits a power supply voltage for the drive circuit;
a light-blocking part on a side of the semiconductor adjacent to the base substrate, wherein the light-blocking part includes a first light-blocking part and a second light-blocking part that are separated and insulated from each other; the first light-blocking part is electrically connected to the power supply voltage signal line; and along a direction perpendicular to a plane of the base substrate, the semiconductor of the transistor is at least partially overlapped with the second light-blocking part; and
a plurality of light-emitting elements, wherein the drive circuit includes a drive module, a data write module, a light-emitting control module, a reset module, and a storage capacitor, wherein:
   the drive module is configured to generate a drive current to drive a light-emitting element, of the plurality of light-emitting elements, to emit light;
   the data write module is configured to selectively provide a data signal for the drive module;

the light-emitting control module is configured to selectively allow the light-emitting element to enter a light-emitting stage, and an input terminal of the light-emitting control module is electrically connected to a first power supply voltage signal line;
   the reset module is configured to reset a control terminal of the drive module;
   the storage capacitor is configured to maintain a potential of the control terminal of the drive module;
   the light-emitting element includes an anode and a cathode, and the cathode of the light-emitting element is electrically connected to a second power supply voltage signal line; and
   the power supply voltage signal line is the first power supply voltage signal line or the second power supply voltage signal line.

2. The display panel according to claim 1, wherein:
the first light-blocking part is connected to the second light-blocking part; or the first light-blocking part is insulated from the second light-blocking part.

3. A display apparatus, comprising the display panel according to claim 1.

4. A display panel, comprising:
a base substrate;
an array layer on a side of the base substrate, wherein:
   the array layer includes a drive circuit, wherein the drive circuit includes a plurality of transistors, and a transistor of the plurality of transistors includes a semiconductor; and
   the array layer further includes a power supply voltage signal line on a side of the semiconductor away from the base substrate, wherein the power supply voltage signal line transmits a power supply voltage for the drive circuit; and
a light-blocking part on a side of the semiconductor adjacent to the base substrate, wherein the light-blocking part includes a first light-blocking part and a second light-blocking part; the first light-blocking part is electrically connected to the power supply voltage signal line; and along a direction perpendicular to a plane of the base substrate, the semiconductor of the transistor is at least partially overlapped with the second light-blocking part, wherein:
   the display panel includes a display region and a non-display region at least partially surrounding the display region;
   the power supply voltage signal line includes a first part and a second part which are connected to each other, wherein the first part is at the non-display region, and the second part is at the display region; and
   the first light-blocking part is electrically connected to the first part.

5. The display panel according to claim 4, wherein:
the first light-blocking part is electrically connected to the first part through a via hole.

6. The display panel according to claim 5, wherein:
along the direction perpendicular to the plane of the base substrate, a first insulating layer is also on a side of the second light-blocking part adjacent to the semiconductor;
a second insulating layer is on the side of the semiconductor away from the base substrate and covers both the semiconductor and the first light-blocking part;
a gate electrode is on a side of the second insulating layer away from the base substrate;

a third insulating layer is on a side of the gate electrode away from the base substrate and covers both the gate electrode and the second insulating layer;

a second metal layer is on a side of the third insulating layer away from the base substrate; and the power supply voltage signal line is at the second metal layer; and the via hole includes a first via hole passing through the second insulating layer and a second via hole passing through the third insulating layer; and the first via hole is connected to the second via hole.

7. The display panel according to claim 6, wherein:

along the direction perpendicular to the plane of the base substrate, an area of an orthographic projection of the second via hole is greater than an area of an orthographic projection of the first via hole.

8. The display panel according to claim 4, wherein:

the non-display region includes an upper frame and a lower frame which are oppositely disposed with each other; and the first light-blocking part is on the upper frame and/or the lower frame.

9. A formation method of a display panel, comprising:

providing a base substrate;

forming a light-blocking layer on the base substrate;

forming a first insulating layer on a side of the light-blocking layer away from the base substrate;

forming an active layer on a side of the first insulating layer away from the base substrate;

providing a mask layer and dividing the display panel into a first sub-region and a second sub-region, wherein a spacing is between the first sub-region and the second sub-region; and etching the active layer, the first insulating layer and the light-blocking layer using a same mask layer; retaining the active layer in the first sub-region as a semiconductor of a transistor; and dividing the light-blocking layer into a first light-blocking part and a second light-blocking part, wherein along a direction perpendicular to a plane of the base substrate, the semiconductor of the transistor is at least partially overlapped with the second light-blocking part.

10. The method according to claim 9, wherein etching the active layer, the first insulating layer and the light-blocking layer using the same mask layer further includes:

removing the active layer in the second sub-region; and retaining the first insulating layer and the light-blocking layer in the second sub-region.

11. The method according to claim 10, after removing the active layer in the second sub-region, further including:

forming a second insulating layer, wherein the second insulating layer covers the first sub-region, the second sub-region and the spacing between the first sub-region and the second sub-region.

12. The method according to claim 9, wherein etching the active layer, the first insulating layer and the light-blocking layer using the same mask layer simultaneously further includes:

simultaneously removing the active layer and the first insulating layer in the second sub-region; and retaining the light-blocking layer in the second sub-region as the first light-blocking part.

13. The method according to claim 12, after simultaneously removing the active layer and the first insulating layer in the second sub-region, further including:

forming a second insulating layer, wherein the second insulating layer covers the first sub-region, the second sub-region and the spacing between the first sub-region and the second sub-region;

forming a first metal layer, performing patterning on the first metal layer, and retaining the first metal layer in the first sub-region to form a gate electrode of the transistor;

forming a third insulating layer on a side of the gate electrode away from the base substrate, wherein the third insulating layer covers the gate electrode, the second sub-region, and the spacing between the first sub-region and the second sub-region;

sequentially etching the third insulating layer and the second insulating layer to form a second via hole passing through the third insulating layer and a first via hole passing through the second insulating layer; and forming a patterned power supply voltage signal line on a side of the third insulating layer away from the base substrate, wherein the patterned power supply voltage signal line is electrically connected to the first light-blocking part.

14. The method according to claim 9, wherein etching the active layer, the first insulating layer and the light-blocking layer using the same mask layer further includes:

forming an entire-surface photoresist on a side of the active layer away from the base substrate;

using the same mask layer to expose and develop the photoresist, wherein the mask layer includes a non-light-transmitting region, a partially light-transmitting region and a fully light-transmitting region; after a developing process, removing the photoresist at a position of the fully light-transmitting region, and thinning the photoresist at a position of the partially light-transmitting region, wherein the non-light-transmitting region corresponds to the first sub-region, and the partially light-transmitting region corresponds to the second sub-region; and corresponding to the spacing between the first sub-region and the second sub-region, etching the active layer, the first insulating layer and the light-blocking layer sequentially.

15. The method according to claim 14, after etching the active layer, the first insulating layer and the light-blocking layer using the same mask layer, further including:

removing the photoresist at the position of the partially light-transmitting region by ashing;

removing the active layer at the position of the partially light-transmitting region by etching; and removing the photoresist at the position of the non-light-transmitting region by ashing to obtain the semiconductor.

16. The method according to claim 15, when removing the active layer at the position of the partially light-transmitting region by etching, further including:

removing the first insulating layer at the position of the partially light-transmitting region by etching.

* * * * *